(12) United States Patent
Yamaji

(10) Patent No.: US 10,658,504 B2
(45) Date of Patent: May 19, 2020

(54) SEMICONDUCTOR INTEGRATED CIRCUIT DEVICE

(71) Applicant: FUJI ELECTRIC CO., LTD., Kawasaki (JP)

(72) Inventor: Masaharu Yamaji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/138,214

(22) Filed: Sep. 21, 2018

(65) Prior Publication Data

US 2019/0157450 A1 May 23, 2019

(30) Foreign Application Priority Data

Nov. 17, 2017 (JP) ................. 2017-222300

(51) Int. Cl.

| H01L 29/78 | (2006.01) |
|---|---|
| H01L 29/06 | (2006.01) |
| H01L 29/08 | (2006.01) |
| H01L 27/06 | (2006.01) |
| H01L 21/761 | (2006.01) |
| H01L 29/739 | (2006.01) |
| H01L 29/40 | (2006.01) |
| H03K 19/0185 | (2006.01) |

(52) U.S. Cl.
CPC ........ *H01L 29/7816* (2013.01); *H01L 21/761* (2013.01); *H01L 27/0629* (2013.01); *H01L 29/063* (2013.01); *H01L 29/0878* (2013.01); *H01L 29/404* (2013.01); *H01L 29/7393* (2013.01); *H01L 29/78* (2013.01); *H01L 29/7832* (2013.01); *H03K 19/018571* (2013.01)

(58) Field of Classification Search
None
See application file for complete search history.

(56) References Cited

U.S. PATENT DOCUMENTS

| 5,894,156 A | 4/1999 | Terashima et al. |
|---|---|---|
| 7,327,007 B2* | 2/2008 | Shimizu ............... H01L 29/0878 257/487 |
| 10,217,861 B2* | 2/2019 | Yamaji .................. H01L 29/405 |
| 2011/0133269 A1 | 6/2011 | Yamaji |
| 2012/0049318 A1 | 3/2012 | Kawamata et al. |

(Continued)

FOREIGN PATENT DOCUMENTS

| JP | 3917211 B2 | 5/2007 |
|---|---|---|
| JP | 3941206 B2 | 7/2007 |

(Continued)

*Primary Examiner* — Michelle Mandala

(57) ABSTRACT

A p⁻-type isolation region is provided at a part between a p-type ground region and a circuit region (a high potential region and an intermediate potential region) in an n-type well region. The p⁻-type isolation region is electrically connected with a H-VDD pad and an n⁺-type drain region of a HVNMOS. The p⁻-type isolation region has between n⁺-type pickup connect regions and between n⁺-type drain regions of two of the HVNMOSs, a protruding part (a T-shaped part, an L-shaped part, a partial U-shaped part) or an additional part that protrudes toward a p-ground region.

14 Claims, 23 Drawing Sheets

(56) References Cited

U.S. PATENT DOCUMENTS

2013/0001736 A1\* 1/2013 Yamaji ............ H01L 21/823481
                                                    257/499
2014/0191281 A1    7/2014 Yamaji
2015/0236013 A1    8/2015 Yamaji
2016/0308534 A1\* 10/2016 Yamaji .................... H01L 21/76
2017/0271506 A1\*  9/2017 Yamaji .................. H01L 29/405

FOREIGN PATENT DOCUMENTS

| JP | 2011-096967 A | 5/2011 |
| JP | 5670669 B2 | 2/2015 |
| JP | 5720792 B2 | 5/2015 |
| JP | 2015-173255 A | 10/2015 |

\* cited by examiner

SEMICONDUCTOR INTEGRATED CIRCUIT DEVICE

CROSS REFERENCE TO RELATED APPLICATIONS

This application is based upon and claims the benefit of priority of the prior Japanese Patent Application No. 2017-222300, filed on Nov. 17, 2017, the entire contents of which are incorporated herein by reference.

BACKGROUND

1. Field

Embodiments of the invention relate to a semiconductor integrated circuit device.

2. Description of Related Art

A high voltage integrated circuit device (HVIC) employing an element isolation method using a high-voltage junction is used as a semiconductor integrated circuit device that drives a switching power device constituting an upper arm of a bridge circuit, such as a pulse width modulation (PWM) inverter, for reverse power conversion (direct current-alternating current conversion). An HVIC includes a temperature detection means and/or an overcurrent detection means for an abnormal state of a switching power device, whereby high performance, electric potential insulation by a transformer, photo-coupler, etc. is not performed, enabling reductions in size and cost of a power supply system to be facilitated.

Connection configuration of a conventional HVIC will be described taking, as an example, a HVIC that drives an insulated gate bipolar transistor (IGBT) used as a switching power device constituting power converter equipment such as an inverter. FIG. 19 is a circuit diagram of a connection configuration of a general high voltage integrated circuit device. FIG. 19 depicts general power converter equipment that includes a half-bridge circuit serially connecting two switching power devices (IGBTs 204, 205).

The power converter equipment depicted in FIG. 19 includes a HVIC, low-voltage power supplies (first and second low-voltage power supplies) 202, 203, the IGBTs 204, 205, free wheeling diodes (FWDs) 206, 207, and an L load (inductive load) 208. The power converter equipment alternately turns on the IGBT 205, which is an upper arm of the half-bridge circuit, and the IGBT 204, which is a lower arm of the half-bridge circuit, and thereby, alternately outputs high potential or low potential from a Vs terminal 201 that is an output terminal and supplies alternating current (AC) power (AC power flows) to the L load 208.

In other words, the HVIC is a driving element that complementarily turns ON and OFF, the IGBT 205 that is the upper arm of the half-bridge circuit and the IGBT 204 that is the lower arm of the half-bridge circuit. When high potential is output from the Vs terminal 201 of the half-bridge circuit, the HVIC turns ON the IGBT 205 of the upper arm and turns OFF the IGBT 204 of the lower arm. On the other hand, when low potential is output from the Vs terminal 201 of the half-bridge circuit, the HVIC turns OFF the IGBT 205 of the upper arm and turns ON the IGBT 204 of the lower arm.

During operation of the HVIC, the HVIC uses a ground (GND) potential as a reference and from an L-OUT terminal, outputs a gate signal to a gate of the IGBT 204 of the lower arm. Additionally, the HVIC uses a potential of the Vs terminal 201 as a reference and outputs from a H-OUT terminal, a gate signal to a gate of the IGBT 205 of the upper arm. Therefore, the HVIC has to include a level shift function (level up circuit, level down circuit) of changing an input signal from external device to a high (H) level or a low (L) level.

In particular, the HVIC includes as internal circuits, a level up circuit, a level down circuit (not depicted), a low side (low potential side) drive circuit (not depicted), and high side (high potential side) drive circuit. Further, the HVIC has external connection terminals such as a H-IN terminal, the H-OUT terminal, a H-VDD terminal, an L-IN terminal, the L-OUT terminal, an L-VDD terminal, a GND terminal, a Vs terminal, an ALM-IN terminal, and an ALM-OUT terminal.

The level up circuit is a complementary metal oxide semiconductor (CMOS) circuit that raises the level of a logic level input signal input from the H-IN terminal and supplies the logic level input signal to a gate of a high-side drive circuit. The level down circuit is a CMOS circuit that when an abnormality detection signal 209 for over-heating, over-current, etc. of the IGBT 205 of the upper arm is detected, receives input of the abnormality detection signal 209 from the ALM-IN terminal, configures an alarm signal, lowers the level of the alarm signal, and outputs the alarm signal from the ALM-OUT terminal to an external device.

The low-side drive circuit is a CMOS circuit that generates a gate signal of the IGBT 204 of the lower arm, based on the logic level input signal input from the L-IN terminal. The L-IN terminal is an input terminal that receives input of an input signal supplied to a gate of the low-side drive circuit. Output (gate signal to the IGBT 204 of the lower arm) of the low-side drive circuit is output from the L-OUT terminal to the gate of the IGBT 204 of the lower arm. The high-side drive circuit is a CMOS circuit that generates a gate signal of the IGBT 205 of the upper arm, based on the input signal input from the level up circuit.

Output (gate signal of the IGBT 205 of the upper arm) of the high-side drive circuit is output from the H-OUT terminal to the gate of the IGBT 205 of the upper arm. The H-VDD terminal is connected to a high potential side of the second low-voltage power supply 203 that uses potential of the Vs terminal as a reference. The L-VDD is connected to a high potential side of the first low-voltage power supply 202 that uses potential of the GND terminal as a reference. The Vs terminal is a terminal of an intermediate potential (floating potential) Vs that varies from a potential (high potential side potential) on a high potential side Vss of a high voltage power supply (main circuit supply power) to a potential of the GND terminal. The GND terminal is an earth terminal to which the GND potential is applied.

The first low-voltage power supply 202 is a low-side driving power supply connected between the GND terminal and the L-VDD terminal of the HVIC. The second low-voltage power supply 203 is a high-side driving power supply connected between the Vs terminal and the H-VDD terminal of the HVIC. The second low-voltage power supply 203, in a case of a bootstrap circuit scheme, is constituted by an external capacitor (not depicted) charged by an external bootstrap diode (not depicted) connected between the L-VDD terminal and the H-VDD terminal of the HVIC.

An emitter of the IGBT 204 of the lower arm is connected to a low potential side GND of the high voltage power supply, and a collector is connected to an emitter of the IGBT 205 of the upper arm. A collector of the IGBT 205 of the upper arm is connected to the high potential side Vss of the high voltage power supply. Further, the FWDs 206, 207 are connected in anti-parallel to the IGBTs 204, 205.

A connection point of the collector of the IGBT 204 of the lower arm and the emitter of the IGBT 205 of the upper arm is the output terminal (the Vs terminal 201) of the half-bridge circuit and is connected to the L load 208 and the Vs terminal of the HVIC. The L load 208 is AC resistance (reactance) of, for example, a motor or lighting driven by the half-bridge circuit (the IGBTs 204, 205).

The level up circuit that is an internal circuit of the HVIC will be described. FIG. 20 is a circuit diagram of the level up circuit that is an internal circuit of the HVIC depicted in FIG. 19. The H-IN terminal, the H-OUT terminal, the H-VDD terminal, the L-VDD terminal and the Vs terminal in FIG. 20 are external connection terminals, and are the H-IN terminal, the H-OUT terminal, the H-VDD terminal, the L-VDD terminal, and the Vs terminal in FIG. 19, respectively.

FIG. 20 depicts as peripheral circuits of a level up circuit (third sub-circuit) 210, a CMOS circuit (hereinafter, low-side sub-circuit (first sub-circuit)) 220 on the low side (upstream) and propagating an input signal to the level up circuit 210, and a CMOS circuit (high-side drive circuit (second sub-circuit)) 230 on the high side (upstream) and propagating an output signal of the level up circuit 210 downstream (to the gate of the IGBT 205 of the upper arm).

The level up circuit 210 depicted in FIG. 20 includes a high voltage n-channel metal oxide semiconductor field effect transistor (MOSFET) that includes an insulated gate constituted by a 3-layer structure of a metal oxide semiconductor material, hereinafter, a HVNMOS 211; the level shift resistor 212; and a diode 213.

A drain of the HVNMOS 211 is connected to one end of the level shift resistor 212 while a source of the HVNMOS 211 is grounded. A connection point of the HVNMOS 211 and the level shift resistor 212 is an output point 214 of the level up circuit 210. Another end of the level shift resistor 212 is connected to the H-VDD terminal. The diode 213 is connected in parallel to the level shift resistor 212. The diode 213 is a clamp element for clamping voltage drop occurring between the ends of the level shift resistor 212 as a consequence of over voltage.

As peripheral circuits of the level up circuit 210, the low-side sub-circuit 220 is disposed upstream from the level up circuit 210 and the high-side drive circuit 230 is disposed downstream. The low-side sub-circuit 220 and the high-side drive circuit 230 include a CMOS circuit connected so as to compensate a p-channel MOSFET (PMOS) and an n-channel MOSFET (NMOS). A gate of the CMOS circuit of the low-side sub-circuit 220 is connected to the H-IN terminal and receives input of an input signal input to the H-IN terminal of the HVIC from an external device.

A source of a p-channel MOSFET 222 of the CMOS circuit of the low-side sub-circuit 220 is connected to the L-VDD terminal while a source of an n-the channel MOSFET 221 is grounded. A connection point (output terminal) 223 of the n-the channel MOSFET 221 and the p-channel MOSFET 222 constituting the CMOS circuit of the low-side sub-circuit 220 is an output terminal that propagates the input signal to the level up circuit 210 and is connected to a gate of the HVNMOS 211 of the level up circuit 210.

A gate of the CMOS circuit of CMOS of the high-side drive circuit 230 is connected to the output point 214 of the level up circuit 210 and receives input of an input signal from the level up circuit 210. A source of the p-channel MOSFET 232 of the CMOS circuit of the high-side drive circuit 230 is connected to the H-VDD terminal and a source of an n-channel MOSFET 231 is connected to the Vs terminal. A connection point 233 of the n-channel MOSFET 231 and the p-channel MOSFET 232 constituting the CMOS circuit of the high-side drive circuit 230 is connected to the H-OUT terminal.

In the level up circuit 210 configured as such, when an input signal is input from the H-IN terminal to the gate of the CMOS circuit of the low-side sub-circuit 220, the input signal is input to the gate of the HVNMOS 211 of the level up circuit 210 by way of the CMOS circuit of the low-side sub-circuit 220. Receiving input of the input signal, the HVNMOS 211 turns ON/OFF, whereby the output signal from the output point 214 of the level up circuit 210 is output to the gate of the CMOS circuit of CMOS of the high-side drive circuit 230.

When the output signal from the level up circuit 210 is input to the gate of the CMOS circuit of CMOS of the high-side drive circuit 230, the CMOS circuit of the high-side drive circuit 230 receiving input of the input signal, turns ON/OFF, whereby the output signal (signal whose level has been raised by the level up circuit 210) of the CMOS circuit of the high-side drive circuit 230 is output from the H-OUT terminal to an external device. The output signal is converted into a signal that is based on the electric potential of the Vs terminal and is input to the gate of the IGBT 205 of the upper arm of the half-bridge circuit, whereby the IGBT 205 turns ON/OFF.

Such power converter equipment is widely used in fields other than for motor control inverters, such as for power supply applications for amusement devices, liquid crystal panels, and inverters for consumer electronics such as air conditioners and lighting. Further, recently, from the perspective of chip area reduction, self-isolation type or junction-isolation type HVICs that employ a self-shielding scheme of integrating a level shift circuit (n-channel MOSFET) and a high-voltage junction termination region (HVJT) have become mainstream.

A cross-sectional structure of a self-isolation type HVIC that employs a conventional self-shielding scheme will be described. FIG. 21 is a plan view of a layout of a conventional high voltage integrated circuit device as viewed from a front surface of a semiconductor substrate. FIG. 22 is a cross-sectional-view of a cross-sectional structure at cutting line AA-AA' in FIG. 21. FIG. 23 is a cross-sectional-view of a cross-sectional structure at cutting line BB-BB' in FIG. 21. A H-VDD pad, a H-OUT pad, a Vs pad, and a GND pad in FIG. 21 are electrode pads having electric potentials equal to those of the H-VDD terminal, the H-OUT terminal, Vs terminal and the GND terminal, respectively, in FIG. 19.

The conventional HVIC depicted in FIGS. 21 to 23 is a self-isolation type HVIC that uses a high-voltage junction that electrically isolates a high potential side (high side) circuit region 241 and a low potential side (low side) circuit region 242 provided on a single semiconductor substrate (semiconductor chip) 250 by a HVJT 243 provided between these circuit regions. The high-potential-side circuit region 241 is selectively provided in a surface layer on a front surface of the semiconductor substrate 250 and is constituted by an n-type well region 253 that has a substantially rectangular planar shape.

In the high-potential-side circuit region 241, a high potential region 244, an intermediate potential region 245, the H-VDD pad, the H-OUT pad, and the Vs pad are disposed. The high potential region 244 is a region that is electrically connected to the H-VDD pad and to which electric potential (electric potential of the high potential side of the second low-voltage power supply 203) of the H-VDD pad is applied. In the high potential region 244, a p+-type source region and an n-type base region of the p-channel MOSFET 232 of the high-side drive circuit 230 in FIG. 20 are disposed.

The intermediate potential region 245 is a region that is electrically connected to the Vs pad and to which electric potential (intermediate potential Vs) of the Vs pad is applied. In the intermediate potential region 245, an n+-type source region, a p-type base region and an n-type offset region (n-type drain diffusion region) of the n-channel MOSFET 231, and a p-type offset region (p-type drain diffusion region) of the p-channel MOSFET 232, etc. of the high-side drive circuit 230 depicted in FIG. 20 are disposed.

Further, in the n-type well region 253, a p−-type region (hereinafter, p−-type isolation region) 261 is provided in a substantially U-shaped layout along three sides of an outer periphery of the n-type well region 253 having a substantially rectangular planar shape. The p−-type isolation region 261 junction isolates a part of the n-type well region 253 positioned more centrally (toward a chip center) than is the p−-type isolation region 261 and an outer part (toward a chip outer periphery) of the n-type well region 253. The part of the n-type well region 253 positioned more centrally than is the p−-type isolation region 261 is a part of the n-type well region 253 in which the high potential region 244, the intermediate potential region 245, the electrode pads, etc. are disposed.

At one edge of the n-type well region 253 where the p−-type isolation region 261 is not disposed, an n+-type pickup connect region 262 is provided linearly along the outer periphery of the n-type well region 253. On the n+-type pickup connect region 262, a pickup electrode 263 is provided. The pickup electrode 263 is in contact with the n+-type pickup connect region 262. The pickup electrode 263 is electrically connected to the H-VDD pad. The pickup electrode 263 is disposed linearly along the n+-type pickup connect region 262.

The low-potential-side circuit region 242 is constituted by a p−-type region 252 that is a part of the semiconductor substrate 250 of a p−-type other than the n-type well region 253. The low-potential-side circuit region 242 surrounds a periphery of the high-potential-side circuit region 241. In the low-potential-side circuit region 242, a low-side drive circuit (not depicted), the low-side sub-circuit 220 depicted in FIG. 20, the GND pad, etc. are disposed. Between the p−-type region 252 and the n-type well region 253, an n−-type well region (breakdown voltage region) 254 and a p-type well region (GND potential region) 255 are provided.

The n−-type well region 254 is in contact with the n-type well region 253 and surrounds the periphery of the n-type well region 253. The n−-type well region 254 constitutes the HVJT 243. In the HVJT 243, the HVNMOS 211 of the level up circuit 210 depicted in FIG. 20 is disposed. In FIG. 21, an n+-type drain region 271, a drain electrode 272 and a gate electrode 273 of the HVNMOS 211 are depicted. Further, in FIG. 21, each HVNMOS 211 for setting (SET) and resetting (RESET) and depiction of parts thereof include "a", "b" appended to the end of the corresponding reference numeral.

The p-type well region 255 is in contact with the n−-type well region 254 and surrounds a periphery of n−-type well region 254 in a ring shape along an outer periphery of the n−-type well region 254. The p-type well region 255 is a common electric potential region to which a common electric potential (e.g., the GND potential) is applied. At a pn junction of the p-type well region 255 and the n−-type well region 254, the p−-type region 252 and the n-type well region 253 are electrically isolated. In the p-type well region 255, a p+-type pickup connect region 264 is selectively provided.

The p+-type pickup connect region 264 is disposed separated from the n−-type well region 254 and surrounds a periphery of the n−-type well region 254 in a ring shape along an outer periphery of the n−-type well region 254. On the p+-type pickup connect region 264, a pickup electrode 265 is provided. The pickup electrode 265 is in contact with the p+-type pickup connect region 264. The pickup electrode 265 is electrically connected with the GND pad. The pickup electrode 265 is disposed in a ring shape along the p+-type pickup connect region 264.

Each black square in FIG. 21 is a part of each of the electrodes 263, 265, 272 deposited on a non-depicted interlayer insulating film covering a chip front surface, the part being embedded in a contact hole. In other words, in FIG. 21, a contact (electrical contact) of the n+-type pickup connect region 262 and the pickup electrode 263 is indicated by a black square labeled with reference numeral 263. A contact of the p+-type pickup connect region 264 and the pickup electrode 265 is indicated by a black square labeled with reference numeral 265. A contact of the n+-type drain region 271 and the drain electrode 272 is indicated by a black square labeled with reference numeral 272.

In FIG. 21, a line connecting the H-VDD pad and the n+-type pickup connect region 262 is a wiring layer connecting the H-VDD pad and the pickup electrode 263. A line connecting the Vs pad and the intermediate potential region 245 is a wiring layer connecting the Vs pad and the intermediate potential region 245. Reference numeral 251 is a part of the semiconductor substrate 250 of a p−-type remaining at a same conductivity type and impurity concentration without formation of the regions 252 to 255. Reference numerals 256, 257, and 258 are a field oxide film, an interlayer insulating film, and a protecting film, respectively.

In the conventional HVIC, as described, the p−-type isolation region 261 is disposed in a substantially U-shaped layout along three edges of the outer periphery of the n-type well region 253, whereby in the n-type well region 253, between the n+-type pickup connect region 262 and the n+-type drain region 271a of the HVNMOS 211a, and between the n+-type pickup connect region 262 and the n+-type drain region 271b of the HVNMOS 211b, and between the n+-type drain regions 271a, 271b of the HVN-MOSs 211a, 211b, parasitic resistances Rs101, Rr101, Rsr101 are respectively present.

In the HVIC of the self-shielding scheme, as a method of realizing stable operation of the level shift circuit, the parasitic resistances Rs101, Rr101 between the n+-type drain region 271 (271a, 271b) of the HVNMOSs 211 (211a, 211b) constituting the level shift circuit (e.g., the level up circuit 210) and the n+-type pickup connect region 262 fixed at the electric potential of the H-VDD pad may be set high.

As a conventional HVIC in which the parasitic resistance between the n+-type drain region of the HVNMOS constituting the level shift circuit and the n+-type pickup connect region fixed at the electric potential of the H-VDD pad is set high, a device has been proposed in which in a breakdown voltage region (n−-type well region constituted by a HVJT) surrounding a periphery of an n-type well region constituting a high-potential-side circuit region, a p−-type isolation region is disposed in a substantially U-shaped layout along three edges of an outer periphery of a high-potential-side circuit region (e.g., refer to Japanese Patent No. 3941206, Japanese Patent No. 5720792, Japanese Laid-Open Patent Publication No. 2015-173255).

Further, as a conventional HVIC, a device has been proposed in which a region where a level shifter (n-channel MOSFET constituting a level shift circuit) of a HVJT is disposed is completely junction isolated from other regions by forming a RESURF structure by a p⁻-type isolation region surrounding a periphery of the level shifter (e.g., refer to Japanese Patent No. 3917211). In Japanese Patent No. 3917211, parasitic resistance between an n⁺-type drain region of the level shifter and an n⁺-type pickup connect region fixed to the electric potential of a H-VDD pad is completely eliminated and only poly-silicon (poly-Si) resistance is used as a level shift resistor.

Further, as another conventional HVIC, a device has been proposed in which an element region of a semiconductor layer of a silicon on insulator (SOI) substrate is insulated and isolated from other element regions by being surrounded like an island by an embedded insulating layer of a lower layer of a semiconductor layer, an insulating film connected to the embedded insulating layer embedded in a trench surrounding a periphery of a high-voltage semiconductor element, and a local oxidation of silicon (LOCOS) film at a SOI substrate surface connected with the insulating film in the trench (e.g., refer to Japanese Patent No. 5670669, Japanese Laid-Open Patent Publication No. 2011-096967).

SUMMARY

According to an embodiment of the present invention, a semiconductor integrated circuit device includes a first second-conductivity-type well region of a second conductivity type provided in a surface layer of a first-conductivity-type semiconductor layer of a first conductivity type; a circuit region formed in the first second-conductivity-type well region; a second second-conductivity-type well region of the second conductivity type provided in the surface layer of the first-conductivity-type semiconductor layer and in contact with the first second-conductivity-type well region, the second second-conductivity-type well region surrounding a periphery of the first second-conductivity-type well region and having an impurity concentration that is lower than that of the first second-conductivity-type well region; a first-conductivity-type well region of the first conductivity type provided in the surface layer of the first-conductivity-type semiconductor layer and in contact with the second second-conductivity-type well region, the first-conductivity-type well region surrounding a periphery of the second second-conductivity-type well region; a first isolating region of the first conductivity type provided separated from and a predetermined distance farther inward than is the first-conductivity-type well region, the first isolating region having a part that in an opened layout, is interposed between the circuit region and the first-conductivity-type well region and that is provided at a depth reaching the first-conductivity-type semiconductor layer from a surface of the first second-conductivity-type well region or the second second-conductivity-type well region; a second-conductivity-type high concentration region of the second conductivity type provided in the first second-conductivity-type well region and having an impurity concentration that is higher than that of the first second-conductivity-type well region; a first electrode in contact with the second-conductivity-type high concentration region; a first field plate that is a part of the first electrode extended farther outward than is an outer periphery of the first second-conductivity-type well region; and an insulated gate semiconductor element having, as a drain region, a second-conductivity-type region of the second conductivity type of the first second-conductivity-type well region or the second second-conductivity-type well region, the second-conductivity-type region being provided a predetermined distance farther inward than is the first isolating region; the insulated gate semiconductor element having, as a drift region, the first second-conductivity-type well region or the second second-conductivity-type well region, or first second-conductivity-type well region and the second second-conductivity-type well region, and the insulated gate semiconductor element having, as a base region, the first-conductivity-type well region. The first isolating region includes any one of: a protruding part at a location other than inside the drain region and protruding farther outward than is the outer periphery of the first second-conductivity-type well region, and an additional part provided separated from and farther outward than is the first isolating region. The protruding part sandwiches the interlayer insulating film with the first field plate and is covered by the first field plate, the protruding part being positioned farther inward than is the outer periphery of the first field plate and the protruding part being near the outer periphery of the first field plate. The additional part sandwiches the interlayer insulating film with the first field plate and is covered by the first field plate, the additional part being positioned farther inward than is the outer periphery of the first field plate and the additional part being near the outer periphery of the first field plate.

In the embodiment, the protruding part is provided between the second-conductivity-type region and the second-conductivity-type high concentration region. The additional part is provided between the second-conductivity-type region and the second-conductivity-type high concentration region.

In the embodiment, two of the insulated gate semiconductor elements are provided separated from each other. The protruding part is provided between the second-conductivity-type regions of the two insulated gate semiconductor elements. The additional part is provided between the second-conductivity-type regions of the two insulated gate semiconductor elements.

In the embodiment, the semiconductor integrated circuit device further includes a second isolation region provided in the second second-conductivity-type well region and opposing the first isolating region on an inner side; a first-conductivity-type high concentration region of the first conductivity type provided in the first-conductivity-type well region, the first-conductivity-type high concentration region having an impurity concentration higher than that of the first-conductivity-type well region; a second electrode in contact with the first-conductivity-type high concentration region; and a second field plate that is a part of the second electrode extending farther inward than is an inner periphery of the first-conductivity-type well region. The second isolation region, at a location other than an outer side of the drain region, sandwiches the interlayer insulating film with the second field plate and is covered by the second field plate, the second isolation region being positioned farther inward than is an inner periphery of the second field plate and the second isolation region being positioned near the inner periphery of the second field plate.

In the embodiment, the protruding part includes any one of: a T-shaped part connected with the first isolating region so as to be orthogonal to the first isolating region and form a T-shape, and T-shaped part protruding farther outward than is the outer periphery of the first second-conductivity-type well region, from a connection point with the first isolating region; an L-shaped part curving a part of the first isolating region so as to be orthogonal to a remaining part of the first isolating region and form an L-shape, the L-shaped part protruding farther outward from the curved part than is the outer periphery of the first second-conductivity-type well region; and both the T-shaped part and the L-shaped part.

In the embodiment, the additional part has a linear shape extending parallel to the first isolating region.

In the embodiment, the semiconductor integrated circuit device further includes a connection part connecting the additional part and the first isolating region.

In the embodiment, the second isolation region is provided between the second-conductivity-type region and the second-conductivity-type high concentration region.

In the embodiment, two of the insulated gate semiconductor elements are provided separated from each other. The second isolation region is provided between the second-conductivity-type regions of the two insulated gate semiconductor elements.

In the embodiment, the semiconductor integrated circuit device further includes a third second-conductivity-type well region of the second conductivity type provided in the surface layer of the first-conductivity-type semiconductor layer, the third second-conductivity-type well region opposing the first second-conductivity-type well region across the first-conductivity-type well region; a first sub-circuit provided in the third second-conductivity-type well region; a second sub-circuit provided in the first second-conductivity-type well region; and a third sub-circuit provided in the second second-conductivity-type well region and the first-conductivity-type well region, the third sub-circuit being connected between the first sub-circuit and the second sub-circuit, and configured to convert a voltage level of a signal input from the first sub-circuit and to output the signal to the second sub-circuit. The third sub-circuit includes an insulated gate semiconductor element; and a resistor constituted by parasitic resistance from the second-conductivity-type region to the second-conductivity-type high concentration region. The second sub-circuit outputs based on a signal output from a connection point of the second-conductivity-type region and the resistor, a gate signal of a transistor of a high potential side among two transistors connected serially.

According to another embodiment of the present invention, a semiconductor integrated circuit device includes a first second-conductivity-type well region of a second conductivity type provided in a surface layer of a first-conductivity-type semiconductor layer of a first conductivity type; a circuit region formed in the first second-conductivity-type well region; a second second-conductivity-type well region of the second conductivity type provided in the surface layer of the first-conductivity-type semiconductor layer and in contact with the first second-conductivity-type well region, the second second-conductivity-type well region surrounding a periphery of the first second-conductivity-type well region and having an impurity concentration that is lower than that of the first second-conductivity-type well region; a first-conductivity-type well region of the first conductivity type provided in the surface layer of the first-conductivity-type semiconductor layer and in contact with the second second-conductivity-type well region, the first-conductivity-type well region surrounding a periphery of the second second-conductivity-type well region; a first isolating region of the first conductivity type provided separated from and a predetermined distance farther inward than is the first-conductivity-type well region, the first isolating region having a part that in an opened layout, is interposed between the circuit region and the first-conductivity-type well region and that is provided at a depth reaching the first-conductivity-type semiconductor layer from a surface of the first second-conductivity-type well region or the second second-conductivity-type well region; a second-conductivity-type high concentration region of the second conductivity type provided in the first second-conductivity-type well region and having an impurity concentration that is higher than that of the first second-conductivity-type well region; a first electrode in contact with the second-conductivity-type high concentration region; a second isolation region provided in the second second-conductivity-type well region and opposing the first isolating region on an inner side; a first-conductivity-type high concentration region of the first conductivity type provided in the first-conductivity-type well region, the first-conductivity-type high concentration region having an impurity concentration higher than that of the first-conductivity-type well region; a second electrode in contact with the first-conductivity-type high concentration region; a first field plate that is a part of the first electrode extending farther outward than is an outer periphery of the first second-conductivity-type well region; a second field plate that is part of the second electrode extending farther inward than is an inner periphery of the first-conductivity-type well region; and an insulated gate semiconductor element having, as a drain region, a second-conductivity-type region of the second conductivity type of the first second-conductivity-type well region or the second second-conductivity-type well region, the second-conductivity-type region being provided a predetermined distance farther inward than is the first isolating region; the insulated gate semiconductor element having, as a drift region, the first second-conductivity-type well region or the second second-conductivity-type well region, or first second-conductivity-type well region and the second second-conductivity-type well region; and the insulated gate semiconductor element having, as a base region, the first-conductivity-type well region. The second isolation region, at a location other than an outer side of the drain region, sandwiches the interlayer insulating film with the second field plate and is covered by the second field plate, the second isolation region being positioned farther inward than is an inner periphery of the second field plate and the second isolation region being positioned near the inner periphery of the second field plate.

In the embodiment, the second isolation region is provided between the second-conductivity-type region and the second-conductivity-type high concentration region.

In the embodiment, two of the insulated gate semiconductor elements are provided separated from each other. The second isolation region is provided between the second-conductivity-type regions of the two insulated gate semiconductor elements.

In the embodiment, the semiconductor integrated circuit device further includes a third second-conductivity-type well region of the second conductivity type provided in the surface layer of the first-conductivity-type semiconductor layer, the third second-conductivity-type well region opposing the first second-conductivity-type well region across the first-conductivity-type well region; a first sub-circuit provided in the third second-conductivity-type well region; a second sub-circuit provided in the first second-conductivity-type well region; and a third sub-circuit provided in the second second-conductivity-type well region and the first-conductivity-type well region, the third sub-circuit being connected between the first sub-circuit and the second sub-circuit, and configured to convert a voltage level of a signal input from the first sub-circuit and to output the signal to the second sub-circuit. The third sub-circuit includes an insulated gate semiconductor element; and a resistor constituted by parasitic resistance from the second-conductivity-type region to the second-conductivity-type high concentration region. The second sub-circuit outputs based on a signal output from a connection point of the second-conductivity-type region and the resistor, a gate signal of a transistor of a high potential side among two transistors connected serially.

Objects, features, and advantages of the present invention are specifically set forth in or will become apparent from the following detailed description of the invention when read in conjunction with the accompanying drawings.

DESCRIPTION OF EMBODIMENTS

Figure 21:
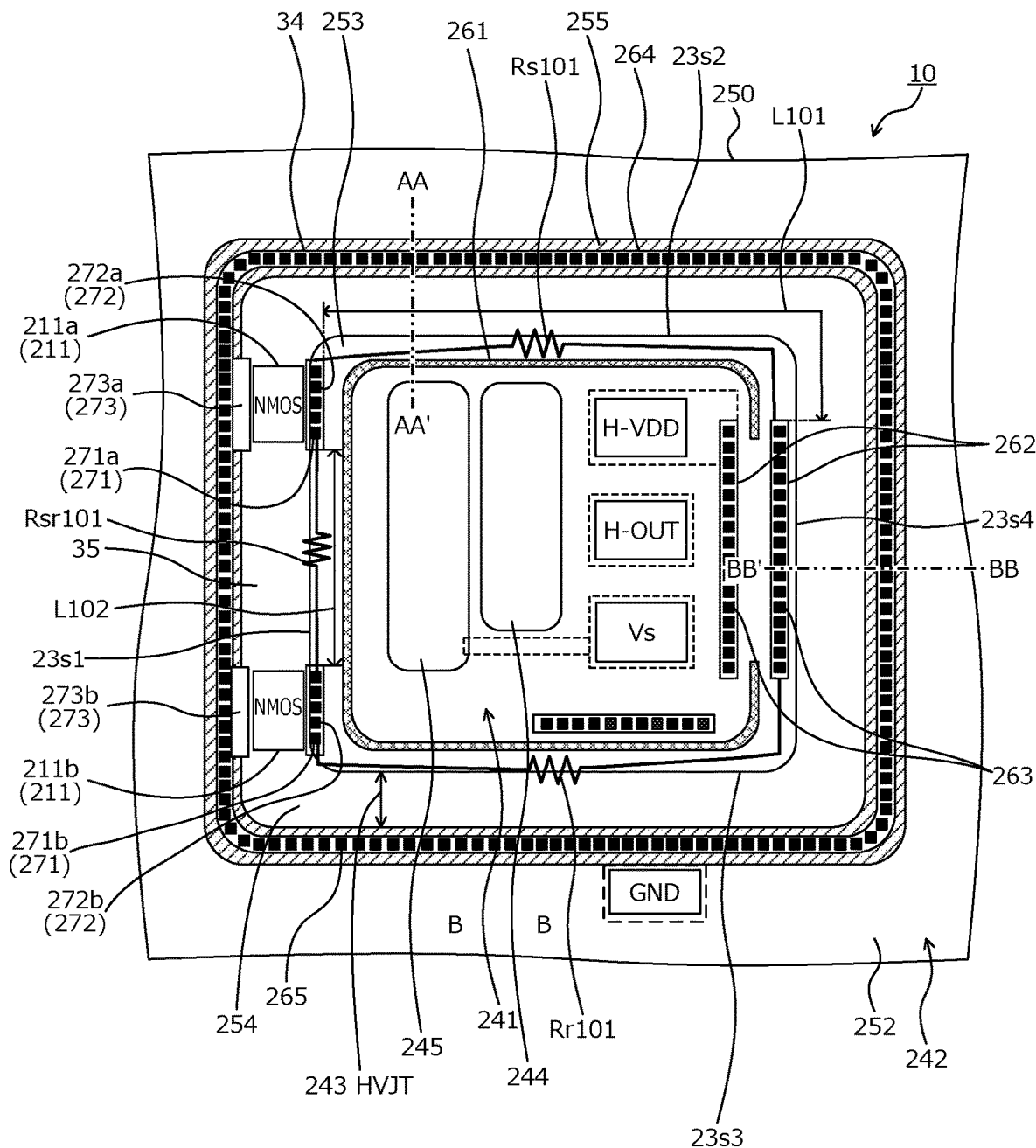
FIG. 21 is a plan view of a layout of a conventional high voltage integrated circuit device as viewed from a front surface of a semiconductor substrate.
Figure 22:
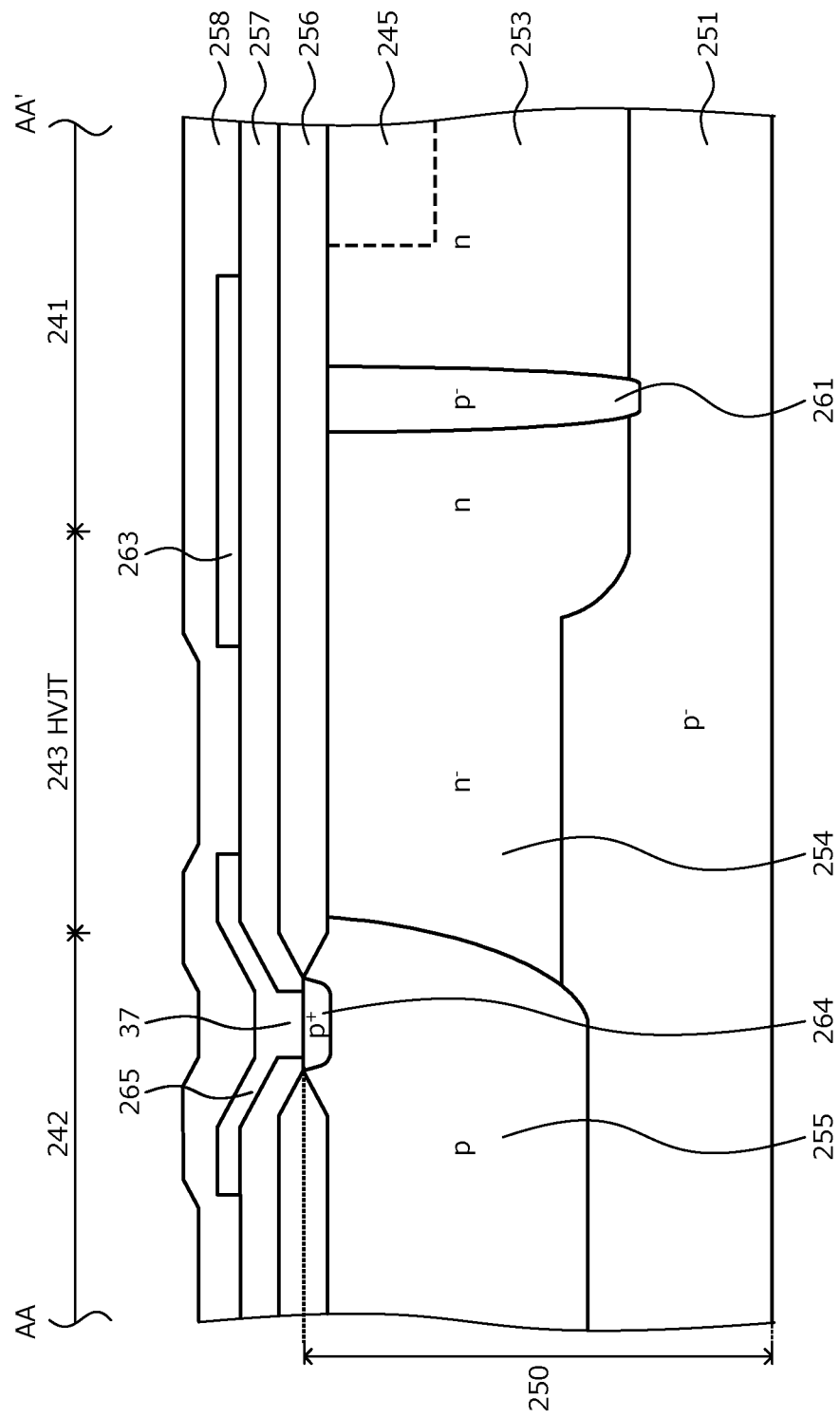
FIG. 22 is a cross-sectional-view of a cross-sectional structure at cutting line AA-AA' in FIG. 21.
Figure 23:
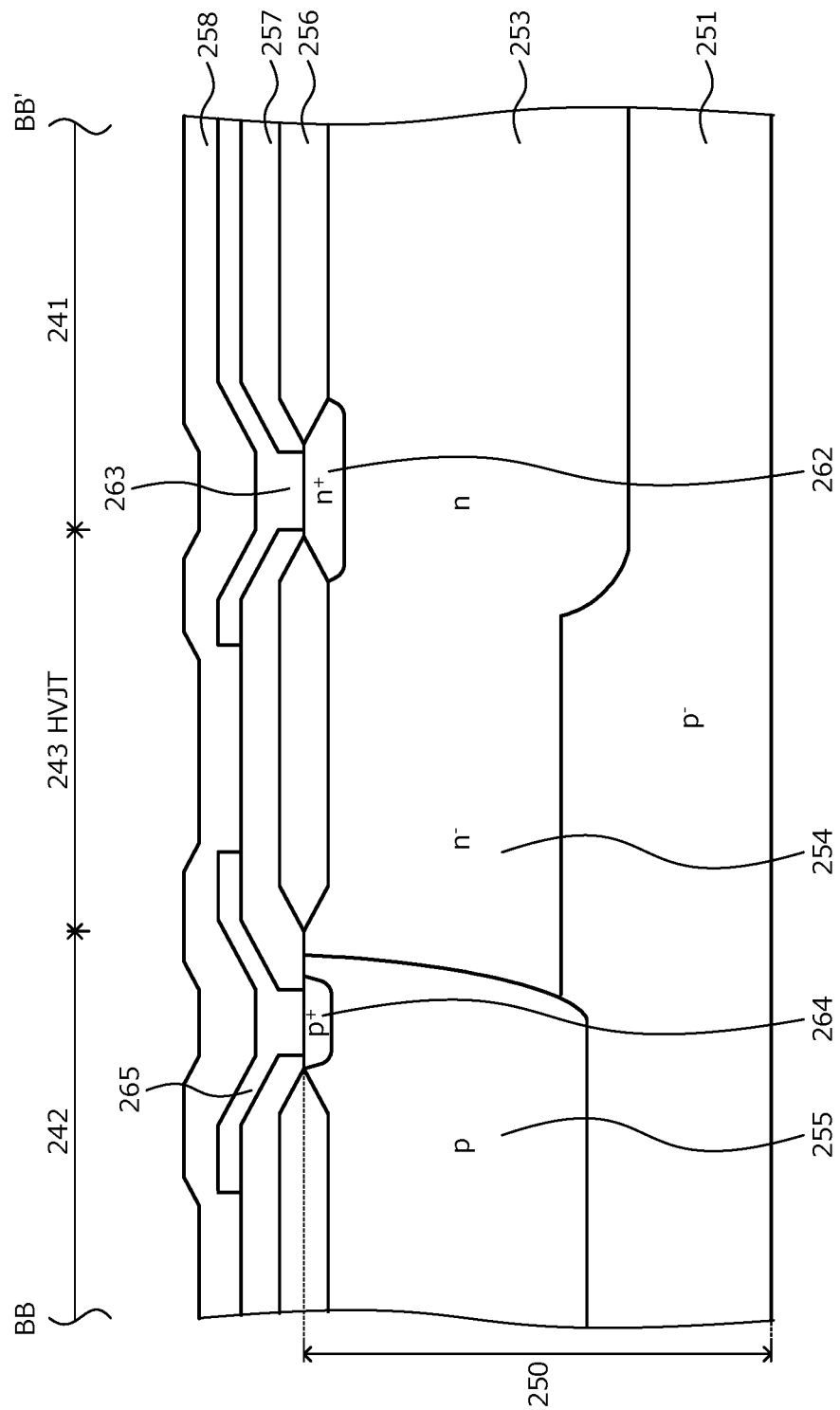
FIG. 23 is a cross-sectional-view of a cross-sectional structure at cutting line BB-BB' in FIG. 21.

First problems associated with the conventional techniques will be discussed. In the HVIC depicted in FIGS. 21, 22, and 23 and in the HVICs described in Japanese Patent No. 3941206, Japanese Patent No. 5720792, Japanese Laid-Open Patent Publication No. 2015-173255, as described, by the p$^-$-type isolation region 261 surrounding the periphery of the high-potential-side circuit region 241 having a substantially U-shape along the outer periphery of the high-potential-side circuit region 241, an inner side of the p$^-$-type isolation region 261 and an outer side of the p$^-$-type isolation region 261 are junction isolated. As a result, closer to a chip edge than is the p$^-$-type isolation region 261, the parasitic resistances Rs101, Rr101 formed at the HVJT 243 are increased and function as the level shift resistor 212 depicted in FIG. 20. Alternatively, poly-silicon resistance, etc. that is a resistance lower than the parasitic resistances Rs101, Rr101 and connected in parallel to the parasitic resistances Rs101, Rr101 is used as the level shift resistor 212.

Nonetheless, in a configuration in which the parasitic resistances Rs101, Rr101 formed at the HVJT 243 are used as the level shift resistor 212, to secure a predetermined low resistance value of the level shift resistor 212, the parasitic resistances Rs101, Rr101 are set, for example, to about a few tens of Ω. In this case, the p$^-$-type isolation region 261 has to be extended from the n$^+$-type drain region 271 of the HVNMOS 211 to the n$^+$-type pickup connect region 262 fixed at the electric potential of the H-VDD pad by a length (hereinafter, overhang length of the p$^-$-type isolation region 261) L101 of 100 μm or more. When the overhang length L101 of the p$^-$-type isolation region 261 increases, large restrictions are imposed on chip layout such as disposal of the HVNMOS 211 and the planar shape of the HVJT 243.

Further, the level up circuit 210 has two input schemes including set (SET) signal and reset (RESET) signal. To eliminate adverse effects due to mutual interference of the HVNMOS 211a for setting and the HVNMOS 211b for resetting disposed in the HVJT 243, a distance L102 separating the n$^+$-type drain regions 271a, 271b of the HVN-MOSs 211a, 211b has to be sufficiently long (e.g., about 1000 μm or more). While elimination of adverse effects due to mutual interference of the HVNMOSs 211a, 211b is dependent on ON flow and the resistance value of the level shift resistor 212 of the HVNMOSs 211a, 211b, the parasitic resistance Rsr101 between the n$^+$-type drain regions 271a, 271b of the HVNMOSs 211a, 211b has to be set to 100 kΩ or higher.

In this case, when sheet resistance of the n$^-$-type well region 254 is 5.0 kΩ/☐ (kilo ohms per square), the distance L102 separating the n$^+$-type drain regions 271a, 271b of the HVNMOSs 211a, 211b has to be increased to an extent that 20 sheets (=100 [kΩ]/5.0 [kΩ/☐]) or greater may be secured between the n$^+$-type drain regions 271a, 271b of the HVNMOSs 211a, 211b. Therefore, a restriction is imposed on the disposal of the HVNMOSs 211a, 211b. Additionally, surface area of the HVJT 243 increases with respect to a minimum required surface area (occupied mathematical area of semiconductor chip) of the high-potential-side circuit region 241 and inactive regions that do not contribute to element operation increase, leading to increased chip size. These problems similarly occur when a level down circuit is disposed in the HVJT 243.

With the technique described in Japanese Patent No. 3917211, the p$^-$-type isolation region that extends in a slit shape (linearly) from the high potential side to the low potential side is provided in the HVJT. Therefore, when the electric potential of the H-VDD pad is raised to a high potential, the HVJT does not uniformly deplete near the high potential side and near the low potential side of the p$^-$-type isolation region, and in the HVJT, electric field may concentrate at the front surface of the semiconductor substrate. Further, due to adverse effects of mobile ions that accumulate over time in a resin (an interlayer insulating film, a protecting film, a sealing resin) covering the front surface of the semiconductor substrate, near the p$^-$-type isolation region, electric potential distribution of the n$^-$-type well region (drift region) is disturbed and long-term reliability may decrease.

Further, charge balance of the n$^-$-type well region and the p$^-$-type isolation region in the HVJT is lost, whereby breakdown voltage may decrease. In other words, with the technique described in Japanese Patent No. 3917211, to obtain long-term reliability of the part of the HVJT isolated in an island-like shape by the RESURF structure formed using the p$^-$-type isolation region, the impurity concentrations of the n$^-$-type well region and the p$^-$-type isolation region in the HVJT have to be optimized, and a high field plate structure having accumulated charge capability such as a low resistance field plate, etc. has to be combined. Further, the amount of contained charges of the sealing resin covering the semiconductor chip has to be defined, and the material of sealing resin, the interlayer insulating film, etc. has to be specified.

Embodiments of a semiconductor integrated circuit device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
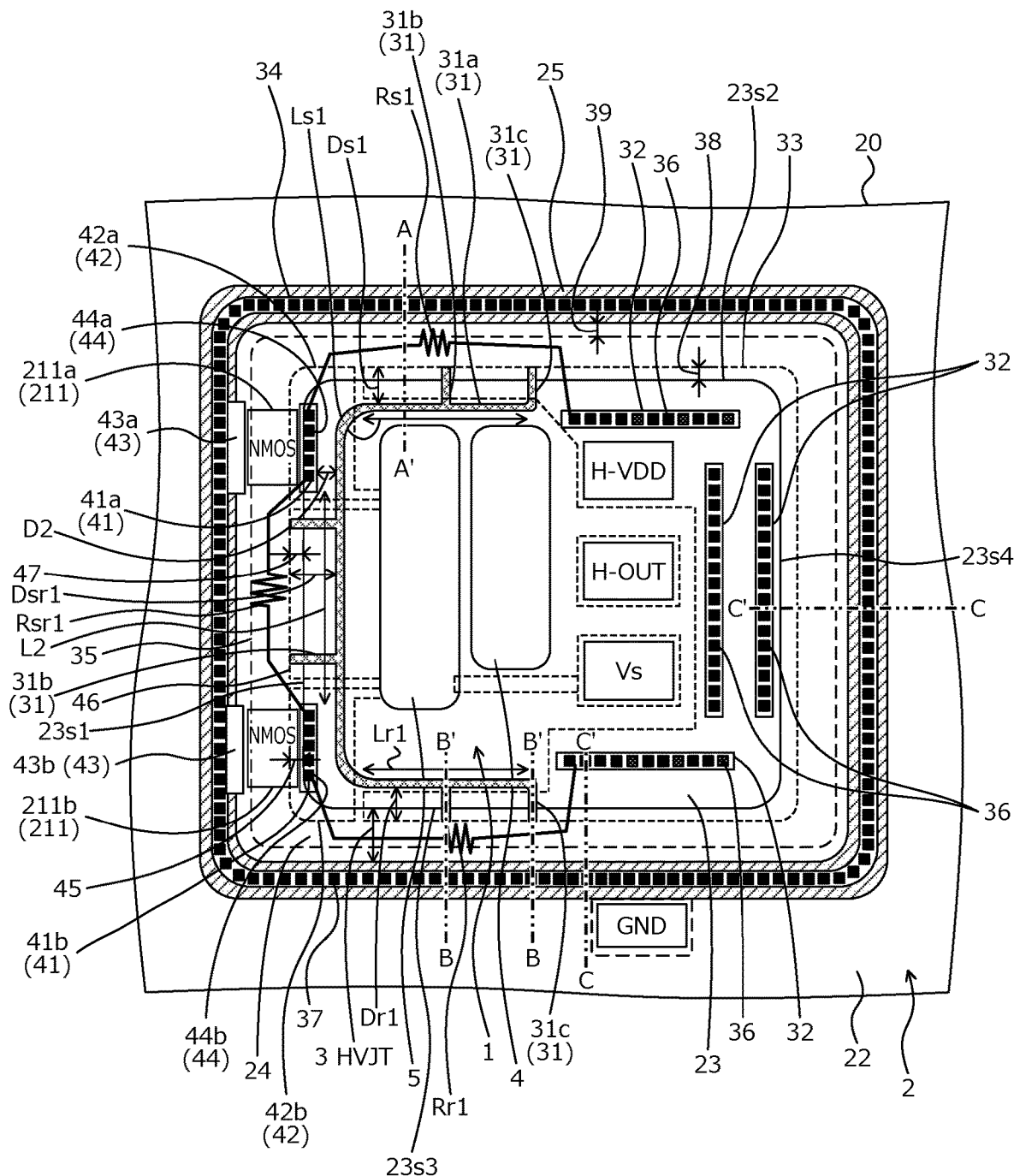
FIG. 1 is a plan view of a layout of a high voltage integrated circuit device according to a first embodiment, as viewed from a front surface side of a semiconductor substrate.
Figure 2:
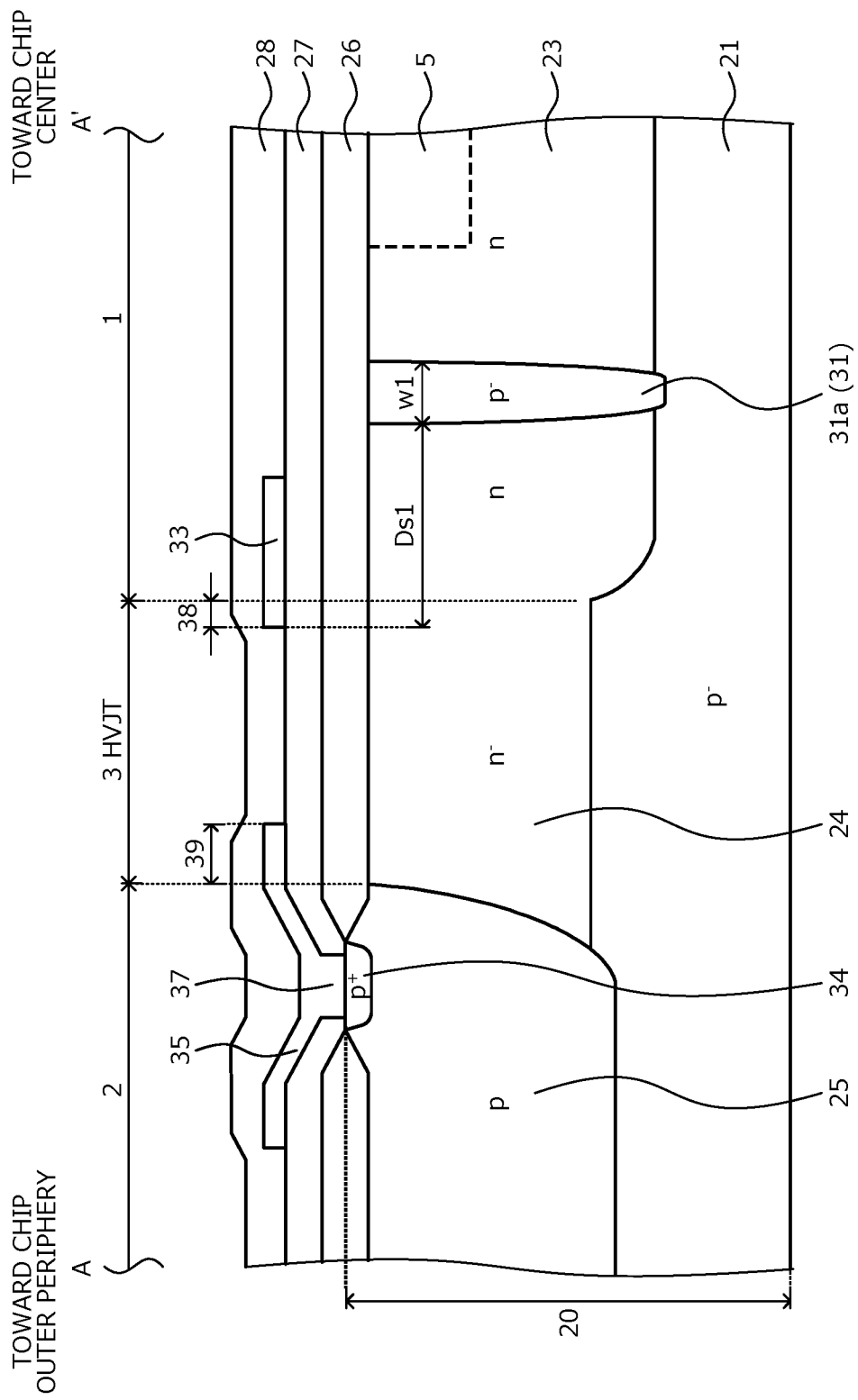
FIG. 2 is a cross-sectional-view of a cross-sectional structure at cutting line A-A' depicted in FIG. 1.
Figure 3:
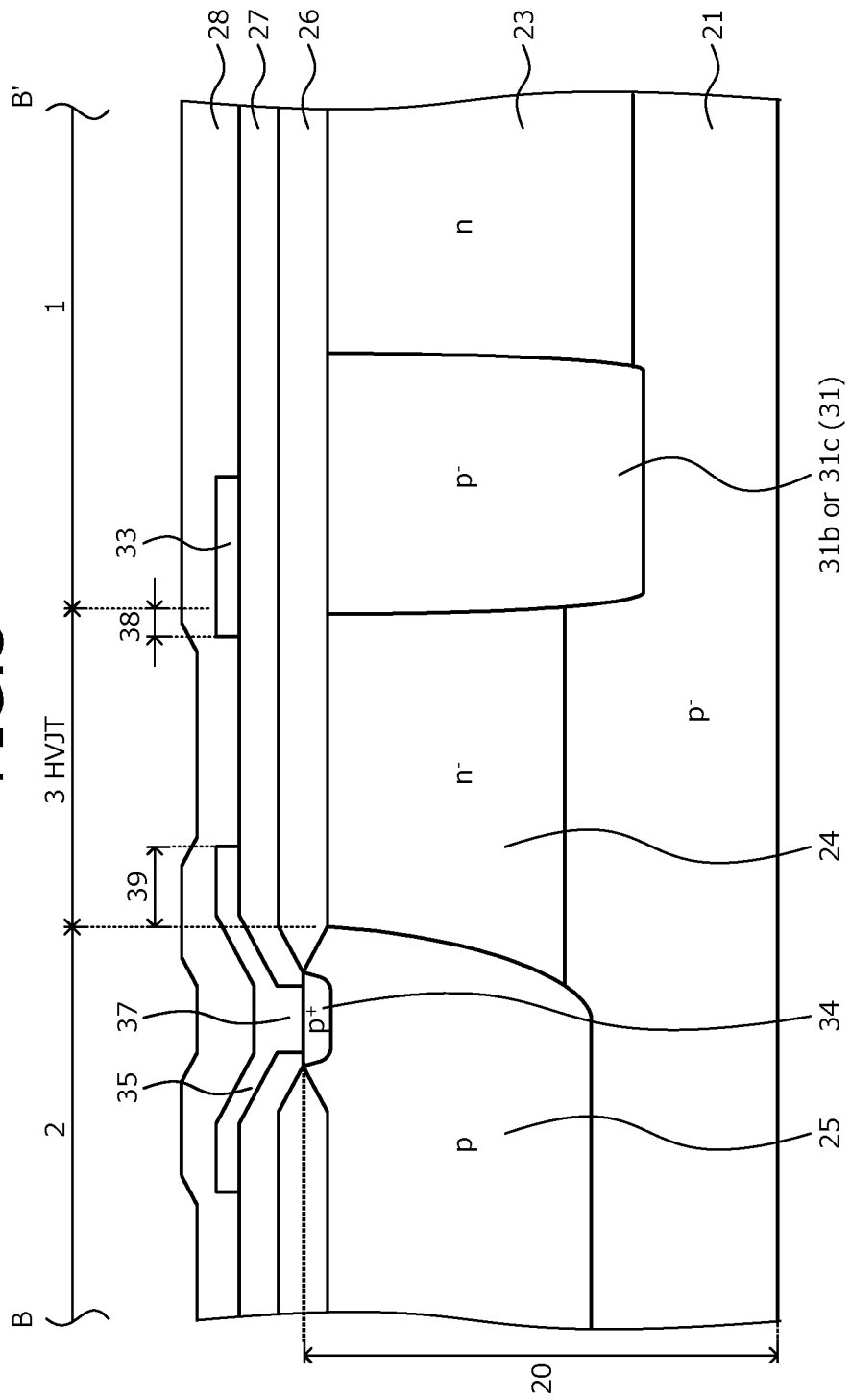
FIG. 3 is a cross-sectional-view of a cross-sectional structure at cutting line B-B' depicted in FIG. 1.
Figure 4:
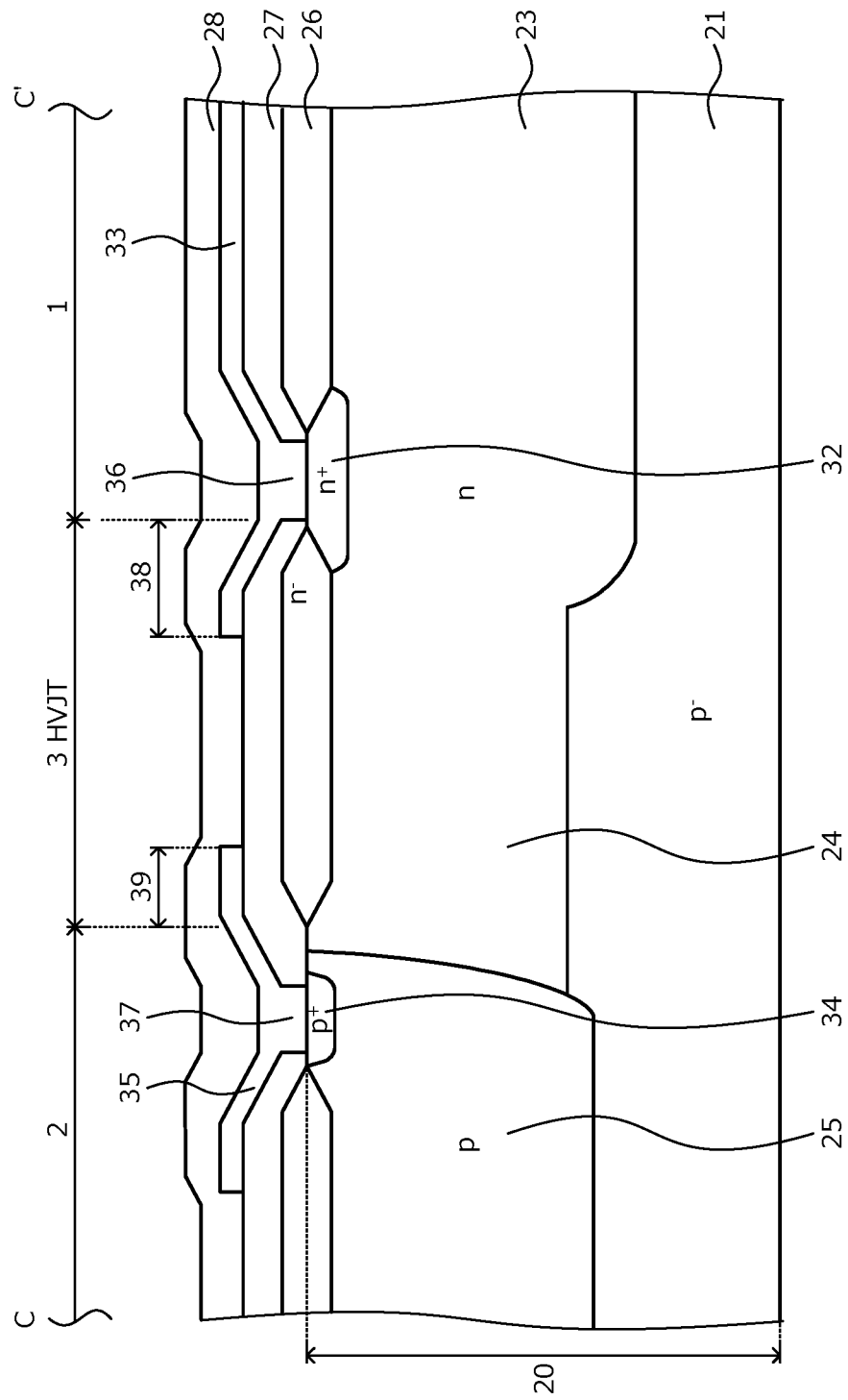
FIG. 4 is a cross-sectional-view of a cross-sectional structure at cutting line C-C' depicted in FIG. 1.

A structure of the semiconductor integrated circuit device according to the first embodiment will be described. FIG. 1 is a plan view of a layout of a high voltage integrated circuit device according to the first embodiment, as viewed from a front surface side of the semiconductor substrate. FIG. 2 is a cross-sectional-view of a cross-sectional structure at cutting line A-A' depicted in FIG. 1. FIG. 3 is a cross-sectional-view of a cross-sectional structure at cutting line B-B' depicted in FIG. 1. FIG. 4 is a cross-sectional-view of a cross-sectional structure at cutting line C-C' depicted in FIG. 1. A H-VDD pad, a H-OUT pad, a Vs pad and a GND pad in FIG. 1 are electrode pads of the same electric potentials as the H-VDD terminal, the H-OUT terminal, the Vs terminal and the GND terminal in FIG. 19.

In FIG. 2, a cross-sectional view at cutting line A-A' is depicted as an example of the structure along a cutting line from a high-side (high potential side) circuit region 1, through a U-shaped part 31a of a p$^-$-type isolation region (first isolating region) 31 and a HVJT 3 to a low-side (low potential side) circuit region 2. In FIG. 3, a cross-sectional view at cutting line B-B' is depicted as an example of the structure along a cutting line from the high-potential-side circuit region 1, through a T-shaped part 31b (or an L-shaped part 31c) of the p$^-$-type isolation region 31 and the HVJT 3, to the low-potential-side circuit region 2. In FIG. 4, a cross-sectional view at cutting line C-C' is depicted as an example of cross-sectional view of the structure of the high-potential-side circuit region 1 where the p$^-$-type isolation region 31 is not disposed.

The semiconductor integrated circuit device according to the first embodiment and depicted in FIGS. 1 to 4, is a high voltage integrated circuit device (HVIC) employing a self-shielding scheme using a high-voltage junction electrically isolating the high-potential-side circuit region 1 and the low-potential-side circuit region 2 provided on a single semiconductor substrate (semiconductor chip) 20, by a high-voltage junction termination region (HVJT) 3 provided between the circuit regions. The HVIC is a driving element corresponding to a HVIC constituting the power converter equipment depicted in FIG. 19 and has a function of controlling ON/OFF of the IGBTs 204, 205 of the half-bridge circuit.

Figure 19:
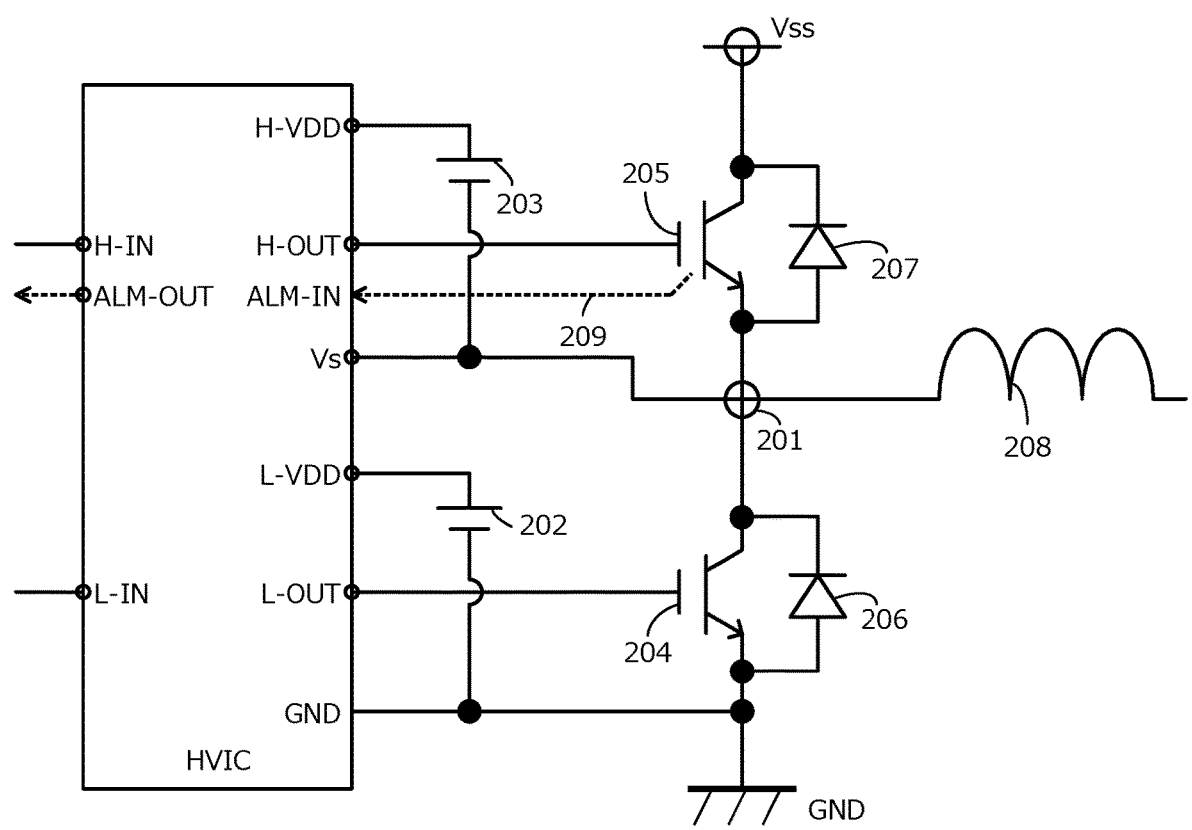
FIG. 19 is a circuit diagram of a connection configuration of a general high voltage integrated circuit device.
Figure 20:
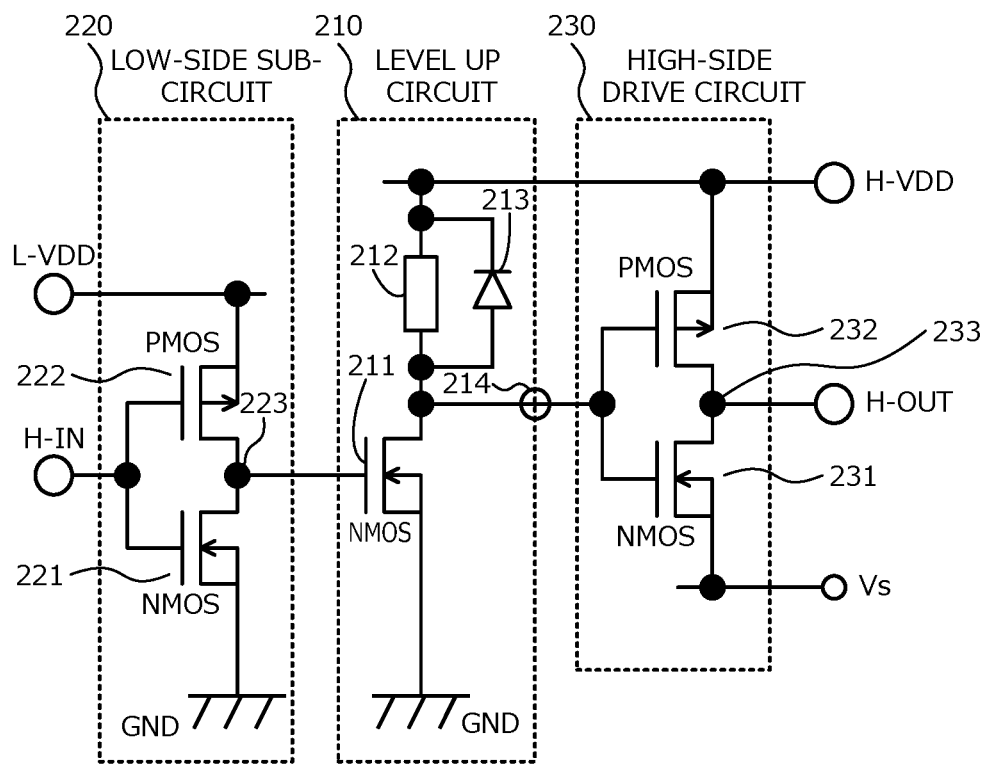
FIG. 20 is a circuit diagram of a level up circuit that is an internal circuit of the HVIC depicted in FIG. 19.

A connection configuration (circuit configuration of power converter equipment) of the HVIC according to the first embodiment and circuit configuration of a level shift function (level shift circuit (the level up circuit 210)), and a driving method of an output circuit (half-bridge circuit constituted by and directly connecting the IGBTs 204, 205) by the HVIC are not described hereinafter and, for example, are similar to the HVIC of power converter equipment depicted in FIG. 19 and a level shift circuit that is an internal circuit of the HVIC depicted in FIG. 20 (refer to FIGS. 19, 20 and the description thereof).

First, a layout of the HVIC according to the first embodiment, as viewed from the front surface side of the semiconductor substrate 20, will be described. The high-potential-side circuit region 1 is provided at the front surface side of the semiconductor substrate 20, for example, in a substantially chip center part. A periphery of the high-potential-side circuit region 1 is surrounded by the HVJT 3. The high-potential-side circuit region 1 is configured in an n-type well region (first second-conductivity-type well region) 23. The n-type well region 23 has, for example, a substantially rectangular planar shape. The high-potential-side circuit region 1 is a region to which electric potential (second electric potential) of the H-VDD pad and electric potential (first electric potential) of the Vs pad are applied. In the high-potential-side circuit region 1, a high potential region 4, an intermediate potential region 5, the H-VDD pad, the H-OUT pad and the Vs pad, etc. are disposed.

The high potential region 4 and the n-type well region 23 are regions that are electrically connected with the H-VDD pad and to which an electric potential (electric potential on the high potential side of the second low-voltage power supply 203 (refer to FIG. 19) of the H-VDD pad is applied. The electric potential of the H-VDD pad is a power supply voltage of a circuit disposed in the n-type well region 23. In the high potential region 4, a $p^+$-type source region and an n-type base region of the p-channel MOSFET 232 (refer to FIG. 20) of the high-side drive circuit 230, etc. are disposed. The n-type well region 23 doubles as an n-type base region of the p-channel MOSFET 232.

The intermediate potential region 5 is a region electrically connected with the Vs pad and to which the electric potential (the intermediate potential Vs) of the Vs pad is applied. In FIG. 1, a wiring layer connecting the intermediate potential region 5 and the Vs pad is indicated by a dotted line connecting the intermediate potential region 5 and the Vs pad. In the intermediate potential region 5, the n-channel MOSFET 231 (refer to FIG. 20), the $n^+$-type source region, the p-type base region and the n-type offset region (n-type drain diffusion region) of the high-side drive circuit 230, and the p-type offset region (p-type drain diffusion region) of the p-channel MOSFET 232, etc. are disposed. FIG. 1 depicts a case in which the high potential region 4 and the intermediate potential region 5 are adjacent and disposed in parallel. Further, in FIG. 1, the high potential region 4 and the intermediate potential region 5 are depicted separately, but may be disposed together in regions in which the high potential region 4 and the intermediate potential region 5 are disposed.

Further, in the n-type well region 23, along an outer periphery of the n-type well region 23, the $p^-$-type region ($p^-$-type isolation region) 31 surrounding a periphery of a part of the n-type well region 23 is provided in a planar layout in which a part is opened (omitted). The planar layout is a planar shape and disposal of regions as viewed from the front surface side of the semiconductor substrate 20. In particular, from an edge 23s1 of the outer periphery of the n-type well region 23, opposing the intermediate potential region 5, the $p^-$-type isolation region 31 extends along two edges 23s2, 23s3 continuous with the edge 23s1. The $p^-$-type isolation region 31 may extend from the edge 23s1 opposing the intermediate potential region 5 to an opposite edge 23s4 opposing the edge 23s1.

Further, the $p^-$-type isolation region 31 includes the substantially U-shaped part (hereinafter, U-shaped part) 31a along the three edges 23s1 to 23s3 of the outer periphery of the n-type well region 23 and a protruding part protruding toward a p-type ground region (first-conductivity-type well region) 25 described hereinafter. The protruding part is continuous with the U-shaped part 31a and thus, forms a substantially T-shaped part (hereinafter, T-shaped part) 31b or a substantially L-shaped part (hereinafter, L-shaped part) 31c, or both. A planar shape and arrangement of the T-shaped part 31b and the L-shaped part 31c of the $p^-$-type isolation region 31 will be described hereinafter. The $p^-$-type isolation region 31 forms a junction isolated structure between a region of a part of the n-type well region 23 and the HVJT 3. Resistance values of the parasitic resistances Rs1, Rr1, Rsr1 described hereinafter are determined by the planar shape and arrangement of the $p^-$-type isolation region 31.

In a part of the n-type well region 23, an $n^+$-type pickup connect region 32 is provided along the outer periphery of the n-type well region 23. In particular, the $n^+$-type pickup connect region 32 is provided in the n-type well region 23, at the opposite edge 23s4 opposing the edge 23s1 that opposes the intermediate potential region 5 and a part of each of the two edges 23s2, 23s3 continuous with the opposite edge 23s4. The $n^+$-type pickup connect regions 32, for example, are disposed separated from each other in linear layout along the respectively corresponding edges 23s2 to 23s4. Two or more of the $n^+$-type pickup connect regions 32 may be disposed parallel to one edge (the edge 23s4 in FIG. 1) of the n-type well region 23.

Further, at a part of the n-type well region 23, the H-VDD pad, the H-OUT pad and the Vs pad are provided closer to a chip center than is the $n^+$-type pickup connect region 32. The H-VDD pad, the H-OUT pad and the Vs pad, for example, are disposed parallel to a direction in which the high potential region 4 extends linearly. The H-VDD pad is electrically connected with the high potential region 4 and a pickup electrode (hereinafter, H-VDD pickup electrode (first electrode) 33. The H-OUT pad is electrically connected with the gate (refer to FIG. 19) of the IGBT 205 that is the upper arm of half-bridge circuit (not depicted). The Vs pad is electrically connected with the intermediate potential region 5. The H-VDD pickup electrode 33 is electrically connected with the $n^+$-type pickup connect region 32.

The H-VDD pickup electrode 33 is a metal layer provided spanning on the $n^+$-type pickup connect region 32 and on the H-VDD pad, via a field oxide film 26 and an interlayer insulating film 27 (not depicted in FIG. 1, refer to FIGS. 2, 3). The H-VDD pickup electrode 33 forms a contact (electrical contact) 36 having an ohmic property with the $n^+$-type pickup connect region 32 (refer to FIG. 4) in each contact hole selectively exposing the $n^+$-type pickup connect region 32. In FIG. 1, while the contact 36 of the $n^+$-type pickup connect region 32 and the H-VDD pickup electrode 33 is indicated by plural black squares, the contact 36 may be formed in a band-shape extending along the $n^+$-type pickup connect region 32.

The H-VDD pickup electrode 33 is disposed, for example, in a substantially U-shaped layout so as to opposing all of the $n^+$-type pickup connect regions 32 and the H-VDD pad in a depth direction. In particular, the H-VDD pickup electrode 33 covers a part of the n-type well region 23 other than the H-OUT pad and the Vs pad, via the field oxide film 26 and the interlayer insulating film 27. Additionally, the H-VDD pickup electrode 33 extends along the outer periphery of the n-type well region 23 and covers the outer periphery of the n-type well region 23, via the field oxide film 26 and the interlayer insulating film 27.

The H-VDD pickup electrode 33 extends farther outward (i.e., onto the HVJT 3) on the interlayer insulating film 27 than is the outer periphery of the n-type well region 23. The part of the H-VDD pickup electrode 33 overhanging (extended onto) the HVJT 3 functions as field plate ((FP) first field plate) 38 of the high potential side. In FIG. 1, the H-VDD pickup electrode 33 is indicated by a dotted line surrounding the H-VDD pad and the $n^+$-type pickup connect region 32. The H-VDD pickup electrode 33 is not provided on a part of the n-type well region 23 where the high potential region 4 and the intermediate potential region 5 are disposed, or on the edge 23s1 of the outer periphery of the n-type well region 23, the edge 23s1 sandwiching the $p^-$-type isolation region 31 with the high potential region 4.

In an outer periphery side of the n-type well region 23, farther outward than is the $p^-$-type isolation region 31 by a predetermined distance, an $n^+$-type drain region (second-conductivity-type region) 41 of the HVNMOS 211 constituting the level up circuit 210 is disposed. The $n^+$-type drain region 41, for example, has a substantially linear planar shape extending along the edge 23s1 of the n-type well region 23. On the n⁺-type drain region 41, a drain electrode 42 is provided, via the field oxide film 26 and the interlayer insulating film 27. The drain electrode 42 is a metal layer provided on the n⁺-type drain region 41, via the field oxide film 26 and the interlayer insulating film 27.

The drain electrode 42 forms a contact (electrical contact) 44 having an ohmic property with the n⁺-type drain region 41 in the contact holes each selectively exposing the n⁺-type drain region 41. In FIG. 1, while the contact 44 of the n⁺-type drain region 41 and the drain electrode 42 is indicated by plural black squares, the contact 44 may be formed in a band-shape extending along the n⁺-type drain region 41. Further, the drain electrode 42 extends farther outward (i.e., onto the HVJT 3) on the interlayer insulating film 27 than is the outer periphery of the n-type well region 23. The part of the drain electrode 42 overhanging (extending onto) the HVJT 3 functions as a field plate 45 of the high potential side.

In FIG. 1, only a gate electrode 43 described hereinafter, the drain electrode 42 and the n⁺-type drain region 41 of the HVNMOS 211 are depicted. The drain electrode 42 of the HVNMOS 211 is depicted by a dotted line surrounding the n⁺-type drain region 41. A case in which signal transmission from the level up circuit 210 to the high-side drive circuit 230 and the output circuit (half-bridge circuit constituted by the IGBTs 204, 205) is performed by two input schemes of a set (SET) signal and a reset signal (RESET). Therefore, in FIG. 1, the HVNMOSs 211 for setting and for resetting and depicted parts thereof include "a", "b" appended to the end of the corresponding reference numeral.

Between the drain electrodes 42a, 42b of the HVNMOSs 211a, 211b for setting and resetting, a pickup electrode 46 is provided. The pickup electrode (hereinafter, Vs pickup electrode) 46 is electrically connected with the Vs pad. The Vs pickup electrode 46 is a metal layer provided on the p⁻-type isolation region 31, via the field oxide film 26 and the interlayer insulating film 27. Provision of the Vs pickup electrode 46 on the p⁻-type isolation region 31 enables external charges of the semiconductor device to be suppressed from accumulating at the field oxide film 26 and the interlayer insulating film 27, and enables suppression of formation of an n-type inversion layer due to accumulated charge in a surface layer of the p⁻-type isolation region 31. The Vs pickup electrode 46 extends farther outward (i.e., onto the HVJT 3) on the interlayer insulating film 27 than is the outer periphery of the n-type well region 23. The part of the Vs pickup electrode 46 overhanging (extended onto) the HVJT 3 functions as a field plate 47.

In place of the H-VDD pickup electrode 33, the Vs pickup electrode may be provided in a substantially same arrangement as the H-VDD pickup electrode 33. When the Vs pickup electrode is provided in place of the H-VDD pickup electrode 33, the Vs pickup electrode is provided spanning on the n⁺-type pickup connect region 32 and on the Vs pad, via the field oxide film 26 and the interlayer insulating film 27, and is electrically connected with the Vs pad. Further, in place of the Vs pickup electrode 46, the H-VDD pickup electrode may be provided in a substantially same arrangement as the Vs pickup electrode 46. When the H-VDD pickup electrode is provided in place of the Vs pickup electrode 46, the H-VDD pickup electrode is electrically connected with the H-OUT pad.

The low-potential-side circuit region 2 is a region in which electric potential (fourth electric potential) of an L-VDD pad (not depicted) of the HVIC and electric potential (third electric potential) of the GND pad is applied. In particular, the low-potential-side circuit region 2 is an n⁻-type well region (third second-conductivity-type well region) 22 disposed farther outward than is the n-type well region 23. The n⁻-type well region 22 is a part of the semiconductor substrate of the p⁻-type, farther outward than is a p-type ground region (first-conductivity-type well region) 25 described hereinafter. In the low-potential-side circuit region 2, the low-side sub-circuit 220 (refer to FIG. 20), the GND pad, the L-VDD pad (not depicted), an H-IN pad (not depicted), etc. are disposed. The L-VDD pad and the H-IN pad are electrode pads of the same electric potentials as the L-VDD terminal and the H-IN terminal depicted in FIG. 19. The HVJT 3 is constituted by an n⁻-type well region (a second second-conductivity-type well region) 24 that is a breakdown voltage region. In the HVJT 3, the HVNMOS 211 of the level up circuit 210 is disposed.

The n⁻-type well region 24 is provided between the n-type well region 23 and the n⁻-type well region 22. The n⁻-type well region 24 is in contact with the n-type well region 23 and surrounds a periphery of the n-type well region 23. A part of the n⁻-type well region 24, as described above, is junction isolated from a part of the n-type well region 23 by the p⁻-type isolation region 31. As a result, between the n⁺-type drain regions 41a, 41b of the HVNMOSs 211a, 211b and the n⁺-type pickup connect regions 32 nearest to the n⁺-type drain regions 41a, 41b respectively, the parasitic resistances Rs1, Rr1 are formed by diffusion resistance (internal resistance) of the n-type well region 23 and the n⁻-type well region 24. The parasitic resistances Rs1, Rr1 constitute the level shift resistor 212 of the level up circuit 210.

In other words, the drain electrode 42a of the HVNMOS 211a for setting is electrically connected with the H-VDD pad, via the n⁺-type drain region 41a, the parasitic resistance Rs1, the n⁺-type pickup connect region 32 and the pickup electrode 33. The drain electrode 42b of the HVNMOS 211b for resetting is electrically connected with the H-VDD pad, the n⁺-type drain region 41b, and the parasitic resistance Rr1, via the n⁺-type pickup connect region 32 and the pickup electrode 33. Poly-silicon resistance (not depicted) may be connected in parallel with the parasitic resistances Rs1, Rr1.

The poly-silicon resistance may be used as the level shift resistor 212 of the level up circuit 210. When the poly-silicon resistance is provided in parallel with the parasitic resistances Rs1, Rr1, the poly-silicon resistance, at the HVJT 3, is provided in the interlayer insulating film 27 and on the interlayer insulating film 27, the field plates 38, 45, 47 on the inner side and a field plate 39 on the outer side and described hereinafter are electrically insulated by the interlayer insulating film 27. The drain electrode 42 of the HVNMOS 211 and the poly-silicon resistance, and the poly-silicon resistance and the H-VDD pad are connected by surface metal wiring (not depicted) disposed at a different level from the poly-silicon resistance.

A connection part (e.g., the drain electrode 42) of the HVNMOS 211 and the parasitic resistances Rs1, Rr1 (or the poly-silicon resistance) constitute an output part 215 of the level up circuit 210. Output from the output part 215 is low electric potential when the HVNMOS 211 is ON and is high electric potential when OFF. Therefore, the HVIC may perform level shift operation that is signal transmission between differing reference electric potentials. Between the n⁺-type drain regions 41a, 41b of the HVNMOSs 211a, 211b, the parasitic resistance Rsr1 is formed by diffusion resistance of the n-type well region 23 and the n⁻-type well region 24. The parasitic resistance Rsr1 has a function of preventing the HVNMOSs 211a, 211b for setting and resetting from turning ON concurrently. A level down circuit (not depicted) may be provided in the HVJT 3.

Between the n⁻-type well region 24 and the n⁻-type well region 22, a common electric potential region is provided. The common electric potential region is a region to which a common electric potential (e.g., the electric potential of the GND pad (ground potential)) is applied. In particular, the common electric potential region is a p-type well region (hereinafter, p-type ground region) 25 provided between the n⁻-type well region 24 and the n⁻-type well region 22 so as to be in contact with both. Hereinafter, the common electric potential will be described as the GND potential. The p-type ground region 25 is disposed in a substantially rectangular layout surrounding a periphery of the n⁻-type well region 24. At a pn junction of the p-type ground region 25 and the n⁻-type well region 24, an inner part and an outer part of the p-type ground region 25 are junction isolated.

The n⁻-type well region 24 and the p-type ground region 25 double as an n⁻-type drift region and a p-type base region of the HVNMOS 211. In the p-type ground region 25, an n⁺-type source region (not depicted) of the HVNMOS 211 is selectively provided. On a surface of a part of the p-type ground region 25 between the n⁺-type source region and the n⁻-type well region 24, the gate electrodes 43 (43*a*, 43*b*) are provided via a gate insulating film. The gate electrodes 43*a*, 43*b* oppose the n⁺-type drain regions 41*a*, 41*b* respectively corresponding thereto. The gate electrodes 43*a*, 43*b* respectively receive input of a set signal and a reset signal.

Further, in the p-type ground region 25, a p⁺-type pickup connect region (first-conductivity-type high concentration region) 34 is selectively provided in a ring-shape along an outer periphery of the n⁻-type well region 24. The p⁺-type pickup connect region 34 doubles as a p⁺-type contact region of the HVNMOS 211. On the p⁺-type pickup connect region 34, a pickup electrode (second electrode) 35 is provided in a ring-shape along the p⁺-type pickup connect region 34. The pickup electrode 35 forms a contact 37 having an ohmic property with the p⁺-type pickup connect region 34 (refer to FIGS. 2 to 4) in each contact hole selectively exposing the p⁺-type pickup connect region 34.

A pickup electrode (hereinafter, GND pickup electrode) 35 is electrically connected with the GND pad. A dotted line surrounding a periphery of the GND pad is a wiring layer connecting the GND pickup electrode 35 and the GND pad. Further, the n⁺-type source region of the HVNMOS 211 is electrically connected with the GND pickup electrode 35. In FIG. 1, while the contact 37 between the p⁺-type pickup connect region 34 and the GND pickup electrode 35 is depicted by black squares, the contact 37 may be formed in a band-shape along the p⁺-type pickup connect region 34.

The GND pickup electrode 35 extends farther inward (i.e., onto the HVJT 3) on the interlayer insulating film 27 than is the inner periphery of the p-type ground region 25. The part of the GND pickup electrode 35 overhanging (extended onto) the HVJT 3 functions as a field plate (second field plate) 39 of the low potential side. In FIG. 1, an inner periphery of the GND pickup electrode 35 is indicated by a dotted line labeled with reference numeral 35. The field plate 39 is disposed separated from the field plates (field plate having the electric potential of the H-VDD pad) 38, 45, 47 and sandwiches the HVJT 3 with the field plates 38, 45, 47.

Arrangement and a planar shape of the U-shaped part 31*a* and the protruding part (the T-shaped part 31*b* and the L-shaped part 31*c*) of the p⁻-type isolation region 31 will be described. The U-shaped part 31*a* of the p⁻-type isolation region 31, as described above, is disposed in a part of the n-type well region 23. The U-shaped part 31*a* of the p⁻-type isolation region 31 forms a U-shape by a linear part of the n-type well region 23 parallel to the edge 23*s*1 and two linear parts parallel to the two edges 23*s*2, 23*s*3 that are substantially orthogonal to the edge 23*s*1 of the n-type well region 23 and connected to ends of the linear part respectively.

The U-shaped part 31*a* of the p⁻-type isolation region 31 is provided farther inward than is the H-VDD pickup electrode 33, and does not oppose the H-VDD pickup electrode 33 in the depth direction. A part of the p⁻-type isolation region 31 farther inward than is the H-VDD pickup electrode 33 surrounds a periphery of a central part of the n-type well region 23 in a substantially ring-shape having an opening and this planar shape may be variously modified. For example, the p⁻-type isolation region 31, in place of the U-shaped part 31*a*, may have a substantially C-shaped part (hereinafter, C-shaped part (not depicted)) along the three edges 23*s*1 to 23*s*3 (or, further extending to a part of the remaining one edge 23*s*4) of the outer periphery of the n-type well region 23.

The T-shaped part 31*b* of the p⁻-type isolation region 31 is a linear part that is connected to any one of the linear parts of the U-shaped part 31*a* of the p⁻-type isolation region 31 so as to be orthogonal to the linear part forming a T-shape, and that protrudes from a connection point with the U-shaped part 31*a* toward the n⁻-type well region 24 to be farther outward than are the edges 23*s*1 to 23*s*3 of the outer periphery of the n-type well region 23. The T-shaped part 31*b* of the p⁻-type isolation region 31 is disposed between the n⁺-type pickup connect region 32 and the n⁺-type drain region 41 of the HVNMOS 211, and between the n⁺-type drain regions 41*a*, 41*b* of the HVNMOSs 211*a*, 211*b*.

Further, the T-shaped part 31*b* of the p⁻-type isolation region 31 sandwiches the field oxide film 26 and the interlayer insulating film 27 with the field plate 38 or the field plate 47 (the overhanging part of the H-VDD pickup electrode 33 or the Vs pickup electrode 46 toward the outer side) in the depth direction and is covered by the field plates 38, 47. In other words, an open end (a first end opposite a second end (connection point) connected to the U-shaped part 31*a*) on an outer side of the T-shaped part 31*b* of the p⁻-type isolation region 31 terminates farther inward than outer peripheries of the field plates 38, 47.

The L-shaped part 31*c* of the p⁻-type isolation region 31 is a linear part that is connected to a linear part that is an end of the open end of the U-shaped part 31*a* of the p⁻-type isolation region 31 so as to be orthogonal to the linear part (or curving the open end of the U-shaped part 31*a*) forming an L-shape, and that protrudes from a connection point (curving part) with the U-shaped part 31*a* toward the n⁻-type well region 24 to be farther outward than are the edges 23*s*2, 23*s*3 of the outer periphery of the n-type well region 23. The L-shaped part 31*c* of the p⁻-type isolation region 31 is disposed between the n⁺-type pickup connect region 32 and the n⁺-type drain region 41 of the HVNMOS 211.

Further, the L-shaped part 31*c* of the p⁻-type isolation region 31 sandwiches the field oxide film 26 and the interlayer insulating film 27 with the field plate 38 (overhanging part of the H-VDD pickup electrode 33 toward the outer side) in the depth direction and is covered by the field plate 38. In other words, an open end (a first end opposite a second end (connection point) connected to the U-shaped part 31*a*) on an outer side of the L-shaped part 31*c* of the p⁻-type isolation region 31 terminates farther inward than is the outer periphery of the field plate 38.

The T-shaped parts 31*b* of the p⁻-type isolation region 31 are disposed separated from each other as are the T-shaped part 31b and the L-shaped part 31c of the p⁻-type isolation region 31. FIG. 1 depicts a case where between the n⁺-type pickup connect region 32 and the n⁺-type drain region 41 of the HVNMOS 211, one each of the T-shaped part 31b and the L-shaped part 31c of the p⁻-type isolation region 31 are disposed, and between the n⁺-type drain regions 41a, 41b of the HVNMOSs 211a, 211b, two of the T-shaped parts 31b of the p⁻-type isolation region 31 are disposed.

The T-shaped part 31b and the L-shaped part 31c of the p⁻-type isolation region 31 are formed connected with a linear part of the U-shaped part 31a to as to be substantially orthogonal to the linear part; however, the T-shaped part 31b and the L-shaped part 31c need not be orthogonal to the linear part of the U-shaped part 31a and form a T-shape or L-shape, and suffice to have a protruding part that simply protrudes farther outward than is the linear part of the U-shaped part 31a. For example, the p⁻-type isolation region 31, in place of the T-shaped part 31b and the L-shaped part 31c, may have a linear part connected obliquely so as to form an obtuse angle of an acute angle with the linear part of the U-shaped part 31a. Further, the protruding part of the p⁻-type isolation region 31 needs not be linear and, for example, may be curved. Moreover, a width of the protruding part of the p⁻-type isolation region 31 may be substantially equal to a width of the linear part of the U-shaped part 31a of the p⁻-type isolation region 31.

In this manner, the protruding part (in FIG. 1, the T-shaped part 31b and the L-shaped part 31c) of the p⁻-type isolation region 31 is provided, whereby distances Ds1, Dr1, Dsr1 from the U-shaped part 31a of the p⁻-type isolation region 31 to the outer peripheries of the field plates 38, 47, and a distance D2 from the U-shaped part 31a of the p⁻-type isolation region 31 to the n⁺-type drain region 41 of the HVNMOS 211 may be virtually shortened. As a result, lengths Ls1, Lr1, L2 described hereinafter for obtaining the predetermined parasitic resistances Rs1, Rr1, Rsr1 within a narrow range may be established. Further, resistance values of the parasitic resistances Rs1, Rr1, Rsr1 may be increased as the number of the T-shaped parts 31b and the L-shaped parts 31c of the p⁻-type isolation region 31 increase.

In particular, the protruding part (the T-shaped part 31b or the L-shaped part 31c, or both) of the p⁻-type isolation region 31 is disposed between the n⁺-type pickup connect region 32 and the n⁺-type drain region 41 of the HVNMOS 211, whereby resistance values of the parasitic resistances Rs1, Rr1 between the n⁺-type pickup connect region 32 and the n⁺-type drain region 41 of the HVNMOS 211 may be increased. Therefore, to obtain predetermined resistance values of the parasitic resistances Rs1, Rr1, the lengths (lengths of the linear parts of the U-shaped part 31a of the p⁻-type isolation region 31: hereinafter, overhang lengths of the p⁻-type isolation region 31) Ls1, Lr1 that the p⁻-type isolation region 31 is extended from the n⁺-type drain region 41 of the HVNMOS 211 to the n⁺-type pickup connect region 32 may be shorter than those of a conventional structure (refer to FIG. 21).

Further, the T-shaped part 31b of the p⁻-type isolation region 31 is disposed between the n⁺-type drain regions 41a, 41b of the HVNMOSs 211a, 211b, whereby the resistance value of the parasitic resistance Rsr1 between the n⁺-type drain regions 41a, 41b of the HVNMOSs 211a, 211b may be increased. Therefore, to obtain a predetermined resistance value of the parasitic resistance Rsr1, the length L2 separating the n⁺-type drain region 41a, 41b of the HVNMOSs 211a, 211b from each other may be shorter than that in the conventional structure. Thus, the p⁻-type isolation region 31 includes the U-shaped part 31a and the protruding part (the T-shaped part 31b and the L-shaped part 31c), whereby even when the p⁻-type isolation region 261 is configured along an inner side of a predetermined distance from the n⁺-type drain region like the conventional structure, there are fewer layout constraints, enabling the degrees of freedom in the arrangement of the level up circuit 210 to be increased and the mathematical area of the chip to be reduced.

Figure 5:
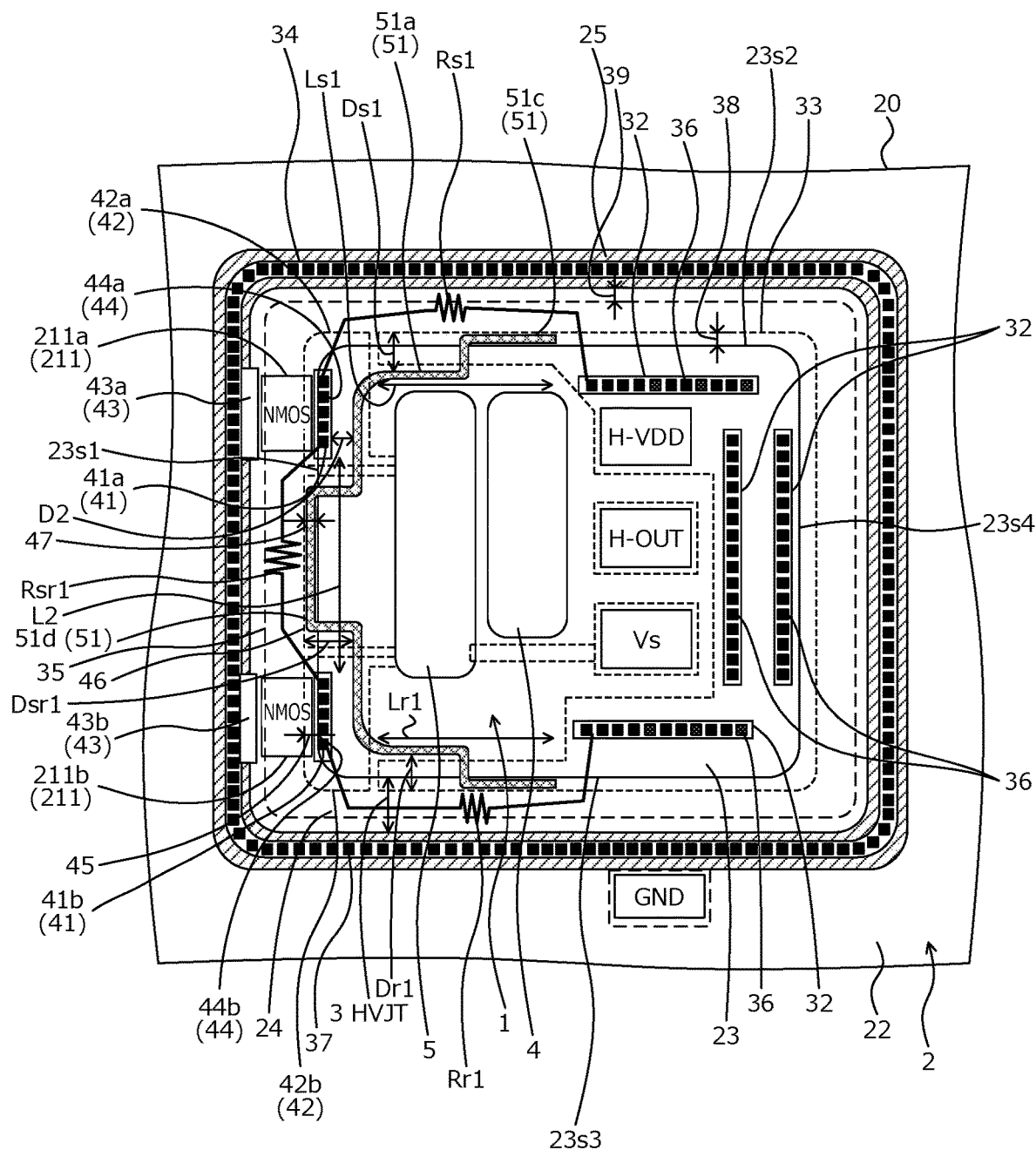
FIG. 5 is a plan view of another example of a layout of the high voltage integrated circuit device according to the embodiment as viewed from the front surface side of the semiconductor substrate.
Figure 6:
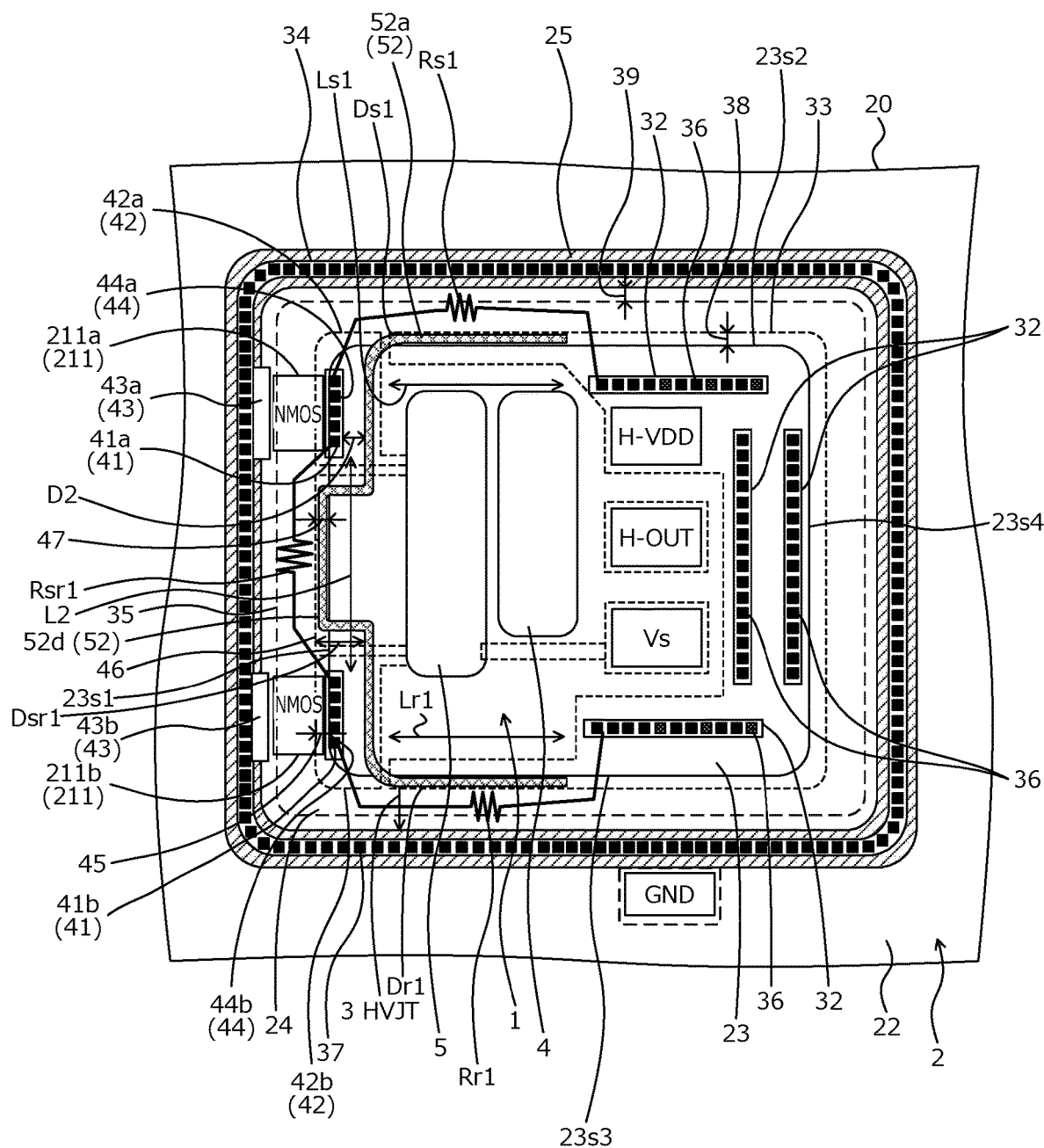
FIG. 6 is a plan view of another example of a layout of the high voltage integrated circuit device according to the embodiment as viewed from the front surface side of the semiconductor substrate.

FIGS. 5 and 6 are plan views of other examples of a layout of the high voltage integrated circuit device according to the embodiment as viewed from the front surface side of the semiconductor substrate. A HVIC depicted in FIGS. 5 and 6 differ from the HVIC depicted in FIG. 1 in that a U-shaped part 51a of a p⁻-type isolation region 51 is close to the outer peripheries of the field plates 38, 47, whereby the distances Ds1, Dr1, Dsr1 from the U-shaped part 51a of the p⁻-type isolation region 51 to the outer peripheries of the field plates 38, 47 are directly shortened and a part of the U-shaped part 51a constitutes the protruding part. In the HVIC depicted in FIGS. 5 and 6, the p⁻-type isolation regions 51, 52 are configured by only U-shaped parts 51a, 52a, an L-shaped part 51c (a protruding part) and partial U-shaped parts 51d, 52d (a protruding part) and no T-shaped part is provided in the p⁻-type isolation regions 51, 52.

In particular, in the p⁻-type isolation region 51 of the HVIC depicted in FIG. 5, an open end side of a linear part that is an end of an open end of the U-shaped part 51a is curved toward the outer side at substantially a right angle forming an L-shape, whereby the L-shaped part 51c that is stepped is formed. Here, in place of curving at substantially a right angle, the open end side of the linear part having the open end of the U-shaped part 51a as an end, the open end side of the linear part having the open end of the U-shaped part 51a as an end may be curved so as to form an obtuse angle with the linear part of the U-shaped part 51a rather than a substantially right angle.

Further, the p⁻-type isolation region 51 of the HVIC depicted in FIG. 5 has a U-shaped layout in which a part of a linear part of the U-shaped part 51a not having the open end is curved so as to protrude toward the outer sides in a substantially rectangular shape, whereby the part (hereinafter, partial U-shaped part) 51d having a stepwise U-shape partially formed by the linear part of the U-shaped part 51a is formed. Here, while an example in which a part of the linear part not having the open end of the U-shaped part 51a is curved so as to protrude in substantially a rectangular shape, the part of the linear part of the U-shaped part 51a suffices to be curved so as to protrude toward the outer sides and in place of the partial U-shaped part 51d, for example, a part that is curved so as to protrude toward the outer sides in a substantially trapezoidal shape may be formed.

In this manner, the L-shaped part 51c and the partial U-shaped part 51d are formed in the U-shaped part 51a of the p⁻-type isolation region 51, whereby the p⁻-type isolation region 51 has a layout in which a part of the U-shaped part 51a is directly close to the outer peripheries of the field plates 38, 47. Therefore, at a portion of the linear parts of the U-shaped part 51a of the p⁻-type isolation region 51, the distances Ds1, Dr1, Dsr1 from the U-shaped part 51a to the outer peripheries of the field plates 38, 47 may be shortened.

The p⁻-type isolation region 52 of the HVIC depicted in FIG. 6 has provided in the n⁻-type well region 24, a linear part having an open end of a U-shaped part 52a as an end, whereby the part of the linear part provided in the n⁻-type well region 24 constitutes the protruding part. The protruding part has a layout in which the linear part having the open end of the U-shaped part 52a as an end is almost entirely directly close to the outer peripheries of the field plates 38,

47. Therefore, in the HVIC depicted in FIG. 6, the distances Ds1, Dr1 from the linear part of the U-shaped part 51a having the open end of the U-shaped part 52a of the p$^-$-type isolation region 52 as an end to the outer periphery of the field plate 38 may be shortened (in FIG. 6, dimension lines of the distances Ds1, Dr1 are not depicted).

In addition, in the p$^-$-type isolation region 52 of the HVIC depicted in FIG. 6, at a linear part not having the open end of the U-shaped part 52a, a partial U-shaped part 52d is formed similarly to the partial U-shaped part 51d of the HVIC depicted in FIG. 5. Therefore, in the HVIC depicted in FIG. 6, similarly to the HVIC depicted in FIG. 5, at a part of the linear part not having the open end of the U-shaped part 52a of the p$^-$-type isolation region 52, the distance Dsr1 from the linear part of the U-shaped part 51a to the outer periphery of the field plate 47 may be shortened.

In other words, the p$^-$-type isolation regions 31, 51, 52 (refer to FIGS. 1, 5, 6) are disposed in a substantially rectangular layout having a part that is opened a predetermined distance inside the p-type ground region and are disposed farther inward than the outer peripheries of the field plates 38, 45. The U-shaped part 31a, the T-shaped part 31b and the L-shaped part 31c of the p$^-$-type isolation region 31; the U-shaped part 51a, the L-shaped part 51c and the partial U-shaped part 51d of the p$^-$-type isolation region 51; and the U-shaped part 52a and the partial U-shaped part 52d of the p$^-$-type isolation region 52 may be disposed at a position near the outer peripheries of the field plates 38, 45 or may extend to a close position, and arrangement may be variously modified.

A cross-sectional structure of the HVIC according to the first embodiment will be described. FIG. 2 depicts a cross-sectional view at cutting line A-A' through the p-type ground region 25, the n$^-$-type well region 24 and the edge 23s2 of the outer periphery of the n-type well region 23. FIG. 3 depicts a cross-sectional view at cutting line B-B' through the p-type ground region 25, the n$^-$-type well region 24 and the edge 23s3 of the outer periphery of the n-type well region 23. FIG. 4 depicts a cross-sectional view at cutting line C-C' through the p-type ground region 25, the n$^-$-type well region 24 and the edge 23s4 of the outer periphery of the n-type well region 23.

As depicted in FIGS. 2 to 4, in the HVIC according to the first embodiment, in a surface layer on a front surface of a p$^-$-type semiconductor substrate (semiconductor chip) 20, the n$^-$-type well regions 22, 24, the n-type well region 23 and the p-type ground region 25 are each selectively provided in the described layouts (in FIG. 2, the n$^-$-type well region 22 is not depicted). From a border of the n-type well region 23 and the n$^-$-type well region 24 toward the chip center is the high-potential-side circuit region 1. From a border of the n$^-$-type well region 24 and the p-type ground region 25 toward the chip outer periphery is the low-potential-side circuit region 2.

From the border of the n-type well region 23 and the n$^-$-type well region 24 to the border of the n$^-$-type well region 24 and the p-type ground region 25 is the HVJT 3. On a rear surface side of the p$^-$-type semiconductor substrate 20, the n$^-$-type well regions 22, 24, the n-type well region 23 and the p-type ground region 25 are not provided and therefore, a p$^-$-type region (hereinafter, p$^-$-type substrate rear-surface-side region (first conductivity type semiconductor layer)) 21 has a conductivity type and an impurity concentration equal to those of the semiconductor substrate 20. The p$^-$-type substrate rear-surface-side region 21 is fixed at the GND potential.

The n-type well region 23 is electrically connected with the H-VDD pad, via the n$^+$-type pickup connect region 32 and the H-VDD pickup electrode 33. In the n-type well region 23, the intermediate potential region 5 and the high potential region 4 (not depicted) are provided at the front surface side of the semiconductor substrate 20. Further, in the n-type well region 23, the p$^-$-type isolation region 31 is provided farther outward (closer to the n$^-$-type well region 24, i.e., closer to the chip outer periphery) than are the high potential region 4 and the intermediate potential region 5.

The p$^-$-type isolation region 31 penetrates the n-type well region 23 from the front surface of the semiconductor substrate 20 and reaches the p$^-$-type substrate rear-surface-side region 21. The p$^-$-type isolation region 31 is fixed at the electric potential (the GND potential) of the p$^-$-type substrate rear-surface-side region 21. A width (width along a direction from the inner side toward the outer side) w1 of the U-shaped part 31a of the p$^-$-type isolation region 31 is a width that enables breakdown voltage characteristics to be maintained even when the electric potential of the H-VDD pad increases to a high electric potential of about 1200V.

In particular, the width w1 of the U-shaped part 31a of the p$^-$-type isolation region 31 is set so that from each pn junction (inner periphery side and outer periphery side) of the inner side of the U-shaped part 31a of the p$^-$-type isolation region 31 and the n-type well regions 23, depletion layers contact each other in the U-shaped part 31a of the p$^-$-type isolation region 31. In other words, the width w1 of the U-shaped part 31a of the p$^-$-type isolation region 31 is set so that the U-shaped part 31a of the p$^-$-type isolation region 31 is depleted. More specifically, the width w1 of the U-shaped part 31a of the p$^-$-type isolation region 31 is, for example, in a range of about 15 μm to 30 μm.

The T-shaped part 31b and the L-shaped part 31c of the p$^-$-type isolation region 31, similarly to the U-shaped part 31a of the p$^-$-type isolation region 31, penetrate the n-type well region 23 from the front surface of the semiconductor substrate 20 and reach the p$^-$-type substrate rear-surface-side region 21, and are fixed at the electric potential (the GND potential) of the p$^-$-type substrate rear-surface-side region 21. The U-shaped part 31a, the T-shaped part 31b and the L-shaped part 31c of the p$^-$-type isolation region 31 are positioned farther inward than is the outer periphery of the field plate 38 (overhanging part of the H-VDD pickup electrode 33 overhanging toward the outer side).

The p-type ground region 25 is an electrical potential fixing region that is electrically connected with the GND pad, via the p$^+$-type pickup connect region 34 and the GND pickup electrode 35, and that fixes the p$^-$-type substrate rear-surface-side region 21 at the GND potential. The p-type ground region 25 functions as a self-isolating region electrically isolating the n$^-$-type well region 22 from the n-type well region 23 and the n$^-$-type well region 24.

The p-type ground region 25 is separated from the n-type well region 23 farther on the n-type well region 23 than is a region of the n$^-$-type well region (n$^-$-type well regions 22, 24) in which the low-side sub-circuit 220 is provided and is provided penetrating the n$^-$-type well region from the front surface of the semiconductor substrate 20 in the depth direction, at a depth reaching the p$^-$-type substrate rear-surface-side region 21.

The n$^+$-type pickup connect region 32 is selectively provided in a surface region (surface layer at the front surface of the semiconductor substrate 20) of the n-type well region 23. The p$^+$-type pickup connect region 34 is selectively provided in a surface region of the p-type ground region 25. At a part of the front surface of the semiconductor substrate 20 other than a region in which contacts with electrodes such as the n+-type pickup connect region 32 and the p+-type pickup connect region 34 are formed, the field oxide film 26 of LOCOS, etc. is provided. On the field oxide film 26, the interlayer insulating film 27 is provided so as to cover the front surface of the semiconductor substrate 20.

The H-VDD pickup electrode 33 is in contact with the n+-type pickup connect region 32, via a contact hole that penetrates the interlayer insulating film 27 in the depth direction, and forms the contact 36 having an ohmic property with the n+-type pickup connect region 32. The GND pickup electrode 35 is in contact with the p+-type pickup connect region 34, via a contact hole that penetrates the interlayer insulating film 27 in the depth direction, and forms the contact 37 having an ohmic property with the p+-type pickup connect region 34.

The H-VDD pickup electrode 33 extends on the interlayer insulating film 27 toward the outer side (the HVJT 3) and constitutes the field plate 38. The GND pickup electrode 35 extends the interlayer insulating film 27 toward the inner side (the HVJT 3) and constitutes the field plate 45. On the interlayer insulating film 27, a protecting film 28 such as a passivation film is provided so as to cover the H-VDD pickup electrode 33 and the GND pickup electrode 35.

A method of manufacturing the HVIC according to the first embodiment will be described. Here, a method of forming diffusion regions (n−-type well regions 22, 24, the n-type well region 23, the p-type ground region 25, the p−-type isolation region 31, the n+-type pickup connect region 32, the p+-type pickup connect region 34), the H-VDD pickup electrode 33 and the GND pickup electrode 35 will be described.

While components (e.g., parts such as the HVNMOSs 211 of the CMOS circuit of the high-side drive circuit 230, the CMOS circuit of the low-side sub-circuit 220 and the level up circuit 210, etc.) other than the HVIC according to the first embodiment and a method of forming these components will not be described herein, these components may be formed in the semiconductor substrate 20 by a general CMOS technique at a predetermined timing (e.g., concurrently with the diffusion regions under similar conditions such as impurity concentration, diffusion depth, etc.).

First, by repeated sessions of photolithography and ion implantation, the n−-type well regions 22, 24 and the n-type well region 23 are selectively formed in the surface layer on the front surface of the semiconductor substrate (semiconductor wafer) 20. The n−-type well regions 22, 24, the n-type well region 23, for example, after ion implantation of an n-type impurity such as phosphorus (P), are formed at a predetermined diffusion depth by diffusing the impurity by heat treatment at a temperature in a range of, for example, about 1100 degrees C. to 1200 degrees C.

Next, by photolithography and ion implantation, in the surface layer on the front surface of the semiconductor substrate 20, the p-type ground region 25 is selectively formed and the p−-type isolation region 31 is formed in the n-type well region 23. The p-type ground region 25 and the p−-type isolation region 31, for example, after ion implantation of a p-type impurity such as boron (B), are formed at a predetermined diffusion depth by diffusing the impurity by heat treatment at a temperature in a range of, for example, about 1100 degrees C. to 1200 degrees C.

A sequence in which the n−-type well regions 22, 24 and the n-type well region 23 are formed may be varied. The n−-type well regions 22, 24, for example, may be concurrently formed by a single ion implantation session. The heat treatment for diffusing the impurity may be performed each time ion implantation is performed to form the n−-type well regions 22, 24, the n-type well region 23, the p-type ground region 25 and the p−-type isolation region 31, or may be performed once for the regions collectively after all of the ion implantations have been completed.

Next, by photolithography and ion implantation, in surface region of the n-type well region 23, the n+-type pickup connect region 32 is selectively formed. The n+-type pickup connect region 32, for example, after ion implantation of an n-type impurity such as arsenic (As), is formed at a predetermined diffusion depth by diffusing the impurity by heat treatment at a temperature in a range of, for example, about 750 degrees C. to 900 degrees C. A surface impurity concentration of the n+-type pickup connect region 32 may be, for example, about $1\times10^{20}/cm^3$.

Next, by photolithography and ion implantation, in a surface region of the p-type ground region 25, the p+-type pickup connect region 34 is selectively formed. The p+-type pickup connect region 34, for example, after ion implantation of a p-type impurity such as boron fluoride ($BF_2$), is formed at a predetermined diffusion depth by diffusing the impurity by heat treatment at a temperature in a range of, for example, about 750 degrees C. to 900 degrees C. A surface impurity concentration of the p+-type pickup connect region 34 may be, for example, about $1\times10^{20}/cm^3$.

Next, by a general method, the field oxide film 26, the interlayer insulating film 27, and contact holes are formed. Next, a metal layer is formed by sputtering and the metal layer is patterned, whereby the H-VDD pickup electrode 33 and the GND pickup electrode 35 are formed by the metal layer embedded in the contact holes. Thereafter, after the protecting film 28 such as a passivation film is formed by a general method, the semiconductor wafer is cut into individual chips, whereby the HVIC depicted in FIG. 1 is completed.

As described, according to the first embodiment, the inner side and the outer side of the p−-type isolation region is junction isolated by the p−-type isolation region. The p−-type isolation region is disposed in a planar layout having a part opened (omitted), whereby at the outer side of a part of the high-potential-side circuit region, the p−-type isolation region is not formed. In addition, the p−-type isolation region has the protruding part that is the T-shaped part or the L-shaped part (or both) between the n+-type pickup connect region (contact region that picks up the electric potential of the H-VDD terminal) disposed in the high-potential-side circuit region and the n+-type drain region of the level shifter (HVNMOS of the level up circuit). In this manner, the protruding part is provided in the p−-type isolation region, whereby the resistance value of the parasitic resistance between the n+-type pickup connect region and the n+-type drain region of the level shifter may be increased as compared to a case in which the protruding part is not provided in the p−-type isolation region.

Since the resistance value of the parasitic resistance between the n+-type pickup connect region and the n+-type drain region of the level shifter may be increased, the parasitic resistance may be used as the level shift resistor. Further, when the parasitic resistance is used as the level shift resistor, the distance from the n+-type drain region of the level shifter to the n+-type pickup connect region for obtaining a predetermined resistance value of the parasitic resistance may be shortened as compared to a case in which the protruding part is not provided in the p−-type isolation region. Further, since the resistance value of the parasitic resistance from n+-type drain region of the level shifter to the n+-type pickup connect region may be increased (e.g., in a HVIC having general specifications, voltage drop at the parasitic resistance used as the level shift resistor is about 20 kΩ to 30 kΩ), and saturation drain current of the level shifter may be set to be smaller (e.g., about 2 mA to 3 mA). Therefore, heat generation of the HVIC may be suppressed.

Further, according to the first embodiment, the p⁻-type isolation region has the protruding part that is the T-shaped part or the partial U-shaped part (or both) between the n⁺-type drain regions of the level shifters for setting and resetting. As a result, the resistance value of the parasitic resistance between the n⁺-type drain regions of the level shifters may be increased as compared to a case in which the protruding part is not provided. As a result, the two level shifters may be prevented from adversely affecting each other. Further, the distance between the n⁺-type drain regions of the two level shifters for obtaining a predetermined resistance value of the parasitic resistance may be shortened as compared to a case in which the protruding part is not provided in the p⁻-type isolation region. Further, according to the first embodiment, the protruding part is provided in the p⁻-type isolation region, whereby the resistance value of the parasitic resistance between the n⁺-type drain regions of the two level shifters may be increased. Therefore, layout design constraints of the level shifter and increases in the mathematical area of the chip occupied by the level shifters associated with obtaining a predetermined resistance value of the parasitic resistance may be prevented.

Further, similarly to Japanese Patent No. 3917211, when a RESURF structure is formed by a p⁻-type isolation region completely surrounding the periphery of the level shifter and the poly-silicon resistance provided in the interlayer insulating film is used as a level shift resistor and the resistance between two level shifter is increased, partial regions of the p⁻-type isolation region where the p-type impurity concentration is high and where the p-type impurity concentration is low occur due to adverse effects by mobile ions accumulated in the interlayer insulating film near the field plates of the high potential side and the low potential side. In this case, high electric field is applied to the partial regions of the p⁻-type isolation region where the p-type impurity concentration is high and where the p-type impurity concentration is low and therefore, long-term reliability of breakdown voltage capability of the HVIC be decreased. In contrast, according to the embodiment of the present invention, as described, the p⁻-type isolation region is disposed in a substantially rectangular layout in which one portion is opened and the poly-silicon resistance needs not be used. Therefore, without sacrificing the long-term reliability of the breakdown voltage characteristics of the HVIC, the resistance value from the n⁺-type drain region of the level shifter to the n⁺-type pickup connect region and the resistance between the two level shifters may be increased.

Further, according to the first embodiment, the protruding part of the p⁻-type isolation region is disposed so as to be positioned closer to chip center than is the outer periphery of the field plate. Therefore, when the pn junction of the p-type ground region (common electric potential region) and the n⁻-type well region (breakdown voltage region) is in a reversed biased state, due to the protruding part of the p⁻-type isolation region, adverse effects of the depletion layer spreading from inside the breakdown voltage region are minimized. Therefore, without adverse effects on the breakdown voltage characteristics and long-term reliability, the resistance value of the parasitic resistance may be increased.

Figure 7:
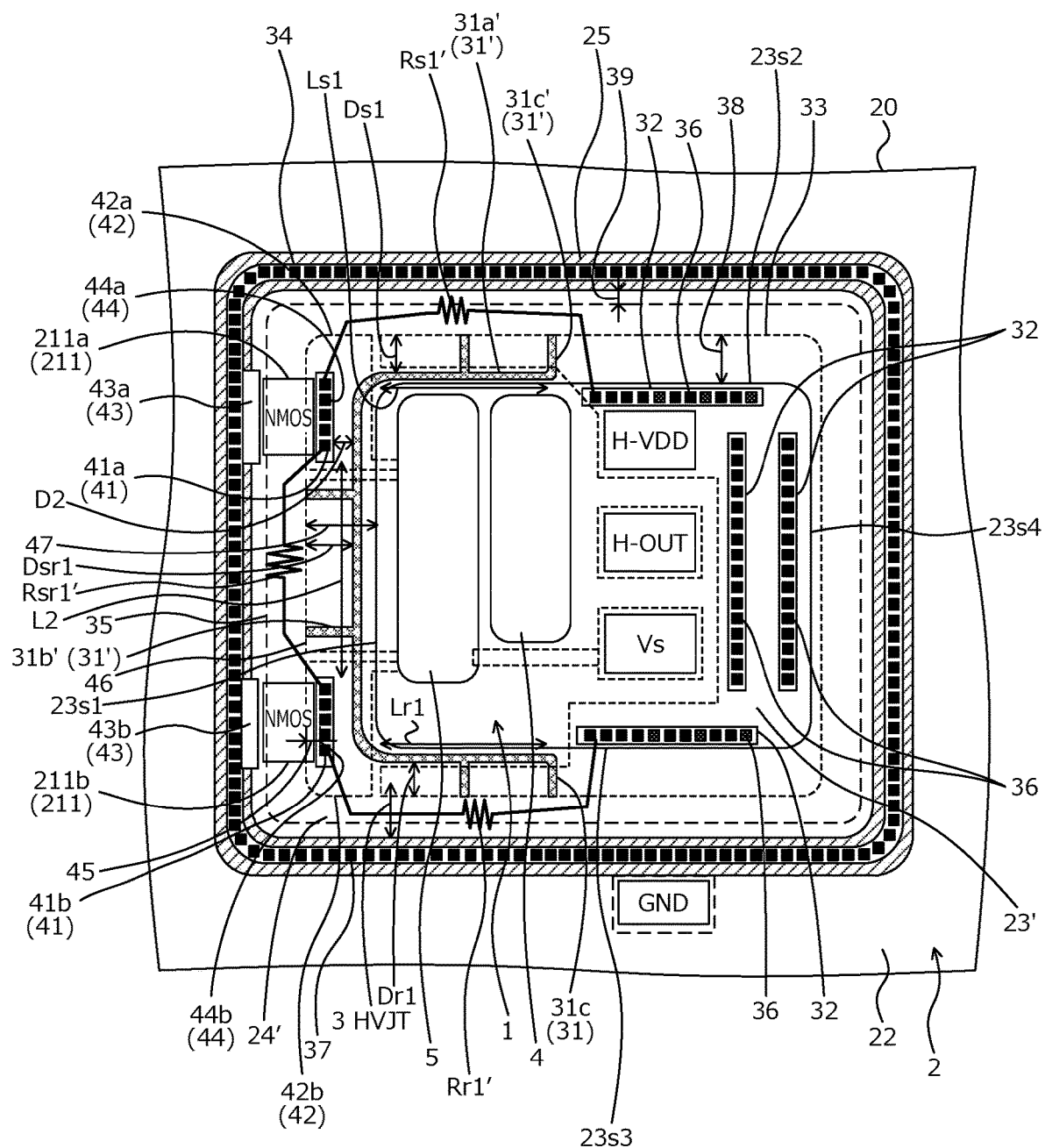
FIG. 7 is a plan view of a layout of the high voltage integrated circuit device according to a second embodiment as viewed from the front surface side of the semiconductor substrate.

A structure of the semiconductor integrated circuit device (HVIC) according to a second embodiment will be described. FIG. 7 is a plan view of a layout of the high voltage integrated circuit device according to the second embodiment as viewed from the front surface side of the semiconductor substrate. The HVIC according to the second embodiment differs from the HVIC according to the first embodiment depicted in FIG. 1 in that a p⁻-type isolation region 31' is disposed in an n⁻-type well region 24'.

The p⁻-type isolation region 31' junction isolates a part of the n⁻-type well region 24' farther inward (toward the chip center) than is the p⁻-type isolation region 31' and a part thereof farther on the outer side (toward the chip outer periphery). Configuration of the U-shaped part 31a', the T-shaped part 31b' and the L-shaped part 31c' of the p⁻-type isolation region 31', other than the disposal of the p⁻-type isolation region 31' in the n⁻-type well region 24' is similar to positional relationships and planar shapes of the field plates 38, 45 and the first embodiment.

In other words, the T-shaped part 31b' of the p⁻-type isolation region 31' is a linear part that is substantially orthogonal to any one of the linear parts of the U-shaped part 31a' of the p⁻-type isolation region 31', protrudes toward the outer side (toward the p-type ground region 25) from a connection point with the U-shaped part 31a' and is connected to the linear part, thereby forming a T-shape. The L-shaped part 31c' of the p⁻-type isolation region 31' is a linear part that is substantially orthogonal to a linear part having an open end of the U-shaped part 31a' of the p⁻-type isolation region 31' as an end, protrudes toward the outer side (toward the p-type ground region 25) from a connection point with the U-shaped part 31a' and is connected to the linear part, thereby forming an L-shape.

A width of the U-shaped part 31a' of the p⁻-type isolation region 31', similarly to the first embodiment, is set so that the U-shaped part 31a' of the p⁻-type isolation region 31' is depleted when the electric potential of the H-VDD pad increases to a high potential of about 1200V. In particular, the width of the U-shaped part 31a' of the p⁻-type isolation region 31' may be in a range of, for example, about 5 µm to 20 µm.

The parasitic resistances Rs1', Rr1' between the n⁺-type drain region 41 and the n⁺-type pickup connect region 32 of the HVNMOS 211 and the parasitic resistance Rsr1' between the n⁺-type drain regions 41a, 41b of the HVNMOSs 211a, 211b are formed by the diffusion resistance of the n⁻-type well region 24.

In the second embodiment, for example, the surface area of the n-type well region 23' is smaller than that in the first embodiment. Further, the extent to which the surface area of the n-type well region 23' is smaller, the surface area of the n⁻-type well region 24' is larger than that in the first embodiment, whereby the chip size may be maintained to be about the same as that in the first embodiment.

A method of manufacturing the semiconductor integrated circuit device according to the second embodiment includes in the method of manufacturing the semiconductor integrated circuit device according to the first embodiment, forming the p⁻-type isolation region 31' in the n⁻-type well region 24' by ion implantation and heat treatment. A diffusion depth of the p⁻-type isolation region 31' penetrates the n⁻-type well region 24' and reaches the p⁻-type substrate rear-surface-side region 21.

The second embodiment may be applied to the HVIC according to the first embodiment depicted in FIGS. 5 and 6.

As described, according to the second embodiment, even when the p⁻-type isolation region is disposed in the breakdown voltage region (n⁻-type well region), effects similar to those of the first embodiment may be obtained.

Figure 8:
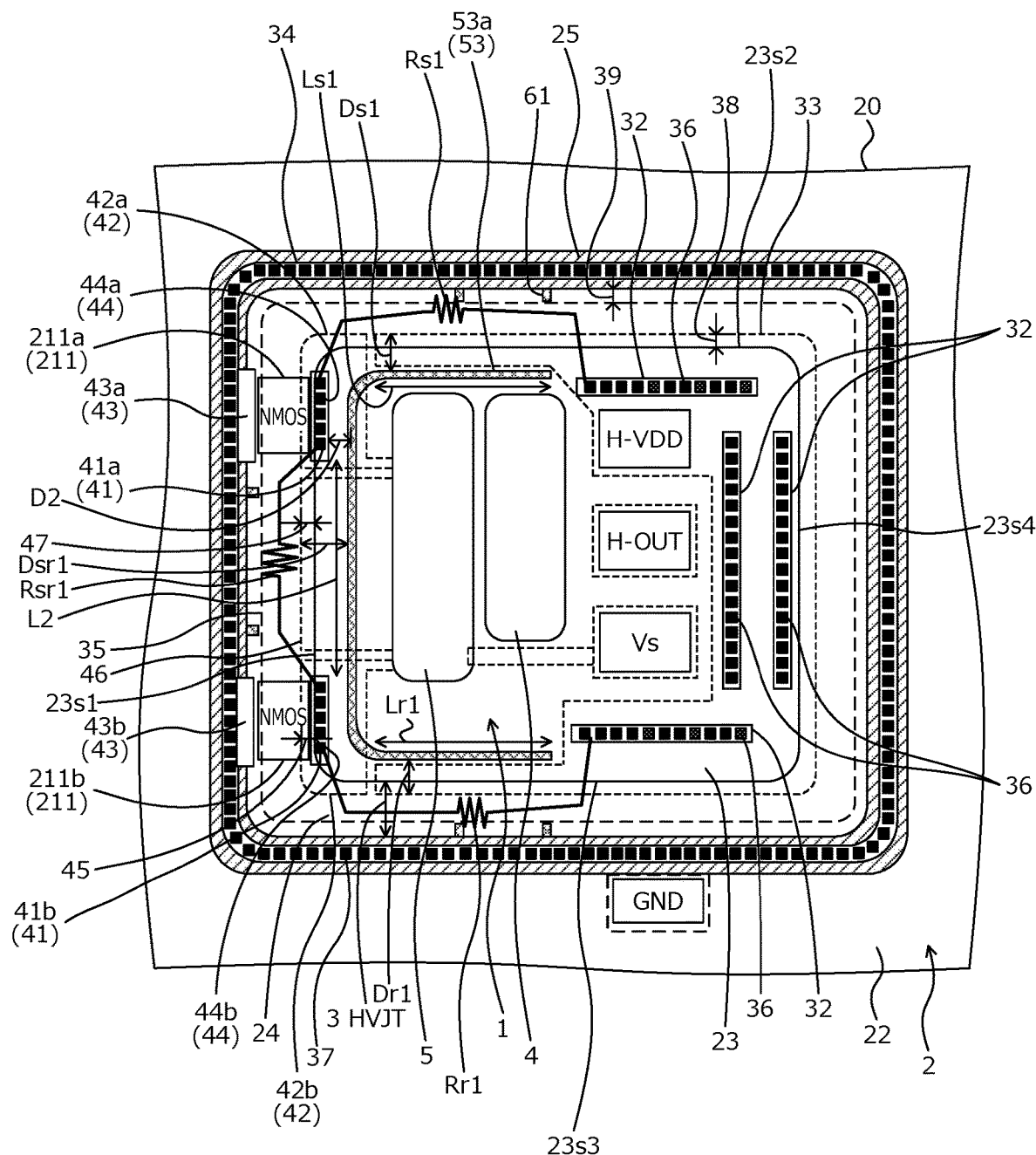
FIG. 8 is a plan view of a layout of the high voltage integrated circuit device according to a third embodiment as viewed from the front surface side of the semiconductor substrate.
Figure 9:
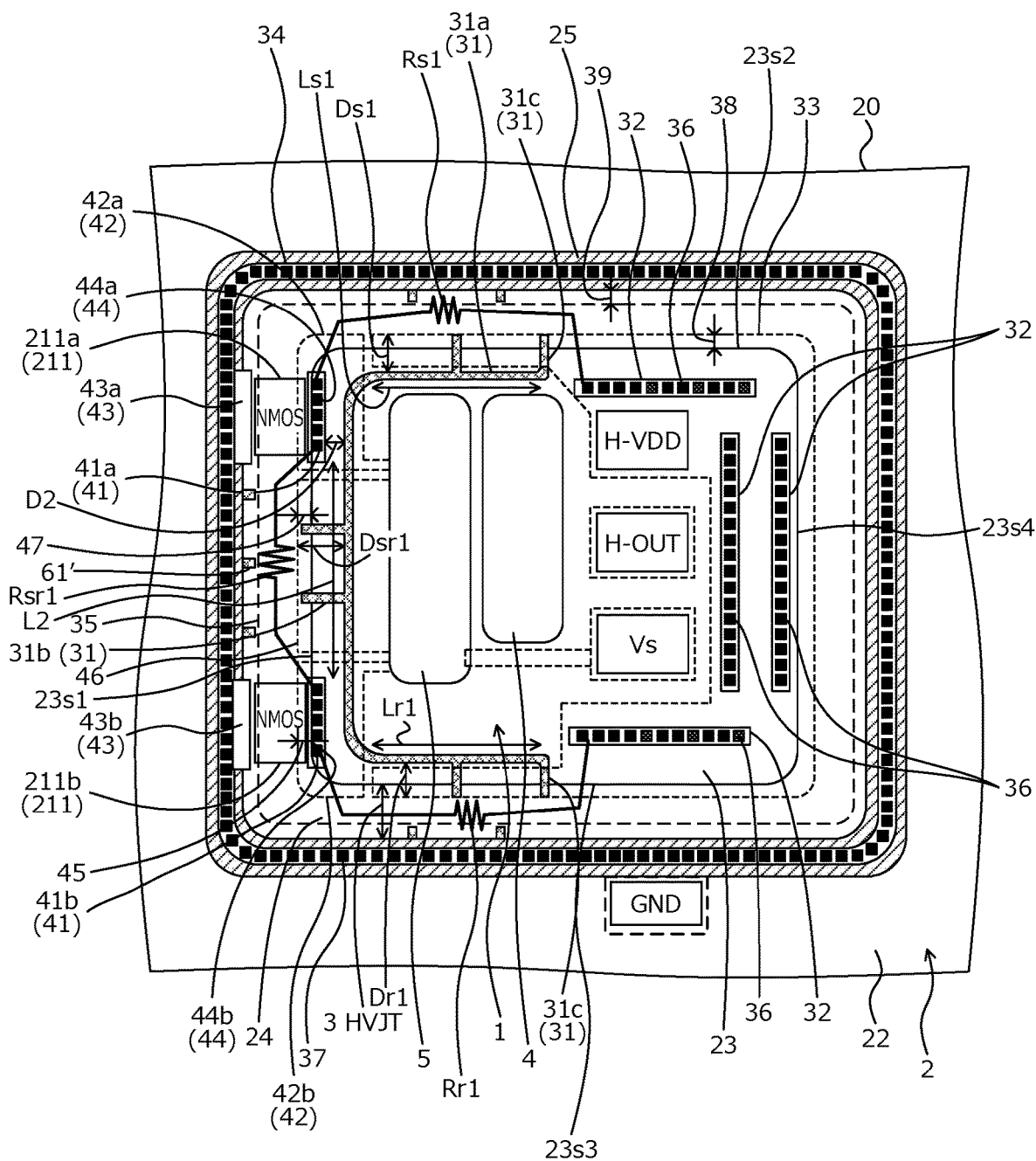
FIG. 9 is a plan view of another example of a layout of the high voltage integrated circuit device according to the third embodiment as viewed from the front surface side of the semiconductor substrate.

A structure of the semiconductor integrated circuit device according to a third embodiment (HVIC) will be described. FIG. 8 is a plan view of a layout of the high voltage integrated circuit device according to the third embodiment as viewed from the front surface side of the semiconductor substrate. FIG. 9 is a plan view of another example of a layout of the high voltage integrated circuit device according to the third embodiment as viewed from the front surface side of the semiconductor substrate.

The HVIC according to the third embodiment differs from the HVIC according to the first embodiment depicted in FIG. 1 in that in the n⁻-type well region 24 that is the breakdown voltage region, a p⁻-type isolation region (hereinafter, low-potential-side p⁻-type isolation region (second isolation region)) 61, 61' is selectively provided at a position opposing, in the depth direction, the field plate 39 of the low potential side.

As depicted in FIGS. 8 and 9, the low-potential-side p⁻-type isolation regions 61, 61' are each a linear part that is, for example, connected to the p-type ground region 25 so as to be substantially orthogonal to the p-type ground region 25 and that protrudes inwardly (toward the p⁻-type isolation regions 53, 31 of the high potential side) from a connection point with the p-type ground region 25. The low-potential-side p⁻-type isolation regions 61, 61' need not be in contact with the p-type ground region 25. Of course, the p⁻-type isolation regions 61, 61' need not be orthogonal to the p-type ground region 25 and may form an obtuse angle with the p-type ground region 25. Further, the p⁻-type isolation regions 61, 61' need not be linear and, for example, may be curved. The p⁻-type isolation regions 53, 31 of the high potential side are each a region that junction isolates the inner side of the p⁻-type isolation region and the outer side of the p⁻-type isolation region.

Further, across the field oxide film 26 and the interlayer insulating film 27 (refer to FIGS. 2 to 4) and are covered by the field plate 39, the p⁻-type isolation regions 61, 61' oppose, in the depth direction, the field plate 39 (the overhanging part of the GND pickup electrode 35 closer to the chip center than is the inner periphery of the p-type ground region 25). In other words, an open end (first end opposite a second end (connection point) connected with the p-type ground region 25) on the inner side of the p⁻-type isolation regions 61, 61' terminates farther outward than is the inner periphery of the field plate 39. In other words, the p⁻-type isolation regions 61, 61' are disposed only beneath (a part opposing in the depth direction, across the interlayer insulating film 27 and the field oxide film 26) the field plate 39 of the low potential side.

Further, the low-potential-side p⁻-type isolation regions 61, 61' are disposed at positions opposing the p⁻-type isolation regions 53, 31 of the high potential side and are separated from the n-type well region 23 and the p⁻-type isolation regions 53, 31 of the high potential side. The low-potential-side p⁻-type isolation regions 61, 61', similarly to the p⁻-type isolation regions 53, 31 of the high potential side, penetrate the n⁻-type well region 24 from the front surface of the semiconductor substrate 20 and reach the p⁻-type substrate rear-surface-side region 21 (refer to FIGS. 2 to 4), and are fixed at the electric potential (the GND potential) of the p⁻-type substrate rear-surface-side region 21. Therefore, the low-potential-side p⁻-type isolation regions 61, 61' have a function similar to the T-shaped part 31b and the L-shaped part 31c of the p⁻-type isolation region 31 (refer to FIG. 9).

In the third embodiment, the p⁻-type isolation region 53 of the high potential side may be constituted by a U-shaped part 53a alone (FIG. 8). Further, the p⁻-type isolation region 31 of the high potential side, similarly to the first embodiment, may have the protruding part (FIG. 9).

The third embodiment may be applied to the HVIC according to the first embodiment depicted in FIGS. 5, 6.

As described, according to the third embodiment, effects similar to those of the first and the second embodiments may be obtained. Further, according to the third embodiment, the p⁻-type isolation region is disposed beneath the field plate of the low potential side, whereby effects similar to those of the p⁻-type isolation region of the high potential side may be obtained.

Figure 10:
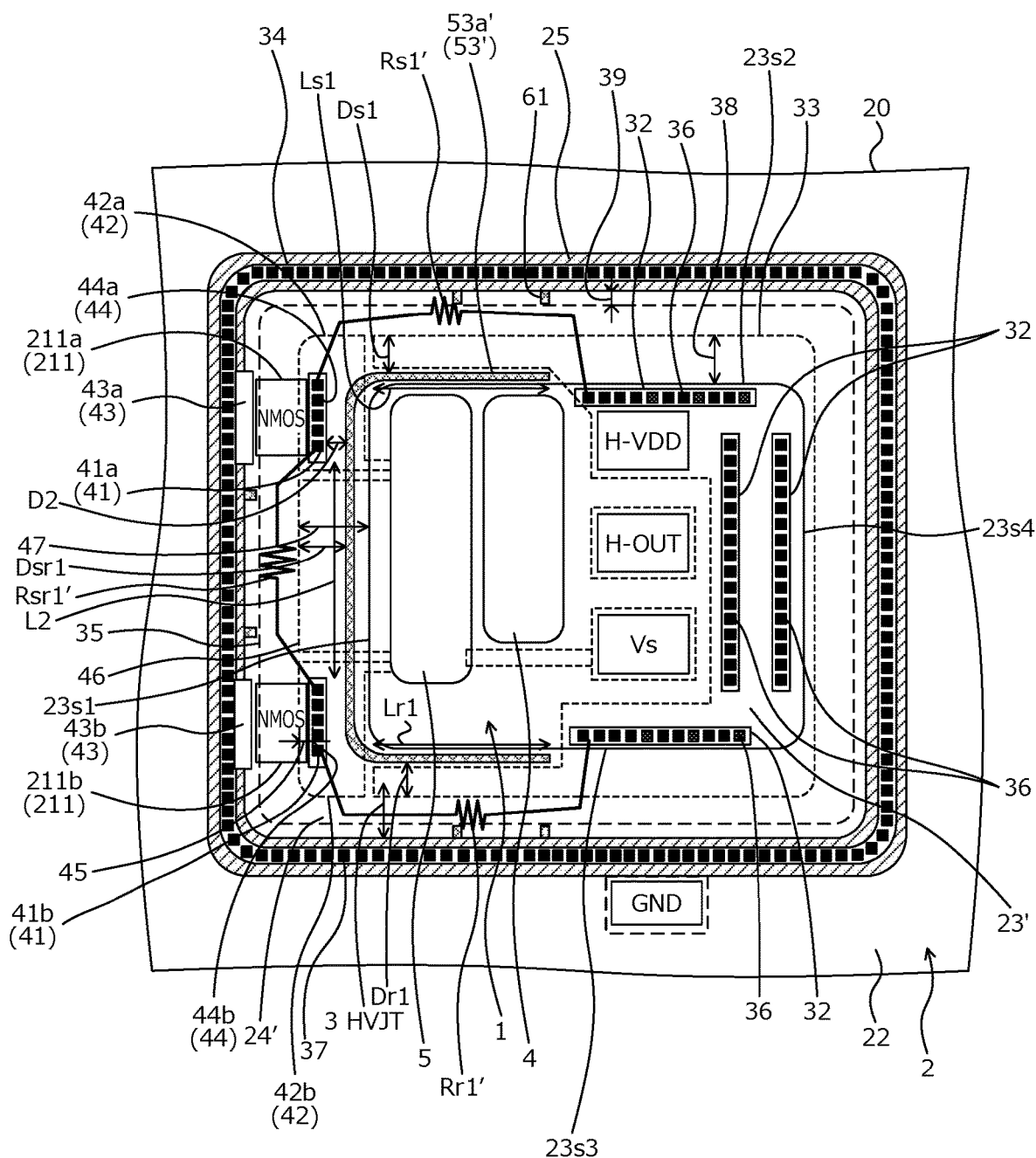
FIG. 10 is a plan view of a layout of the high voltage integrated circuit device according to a fourth embodiment as viewed from the front surface side of the semiconductor substrate.
Figure 11:
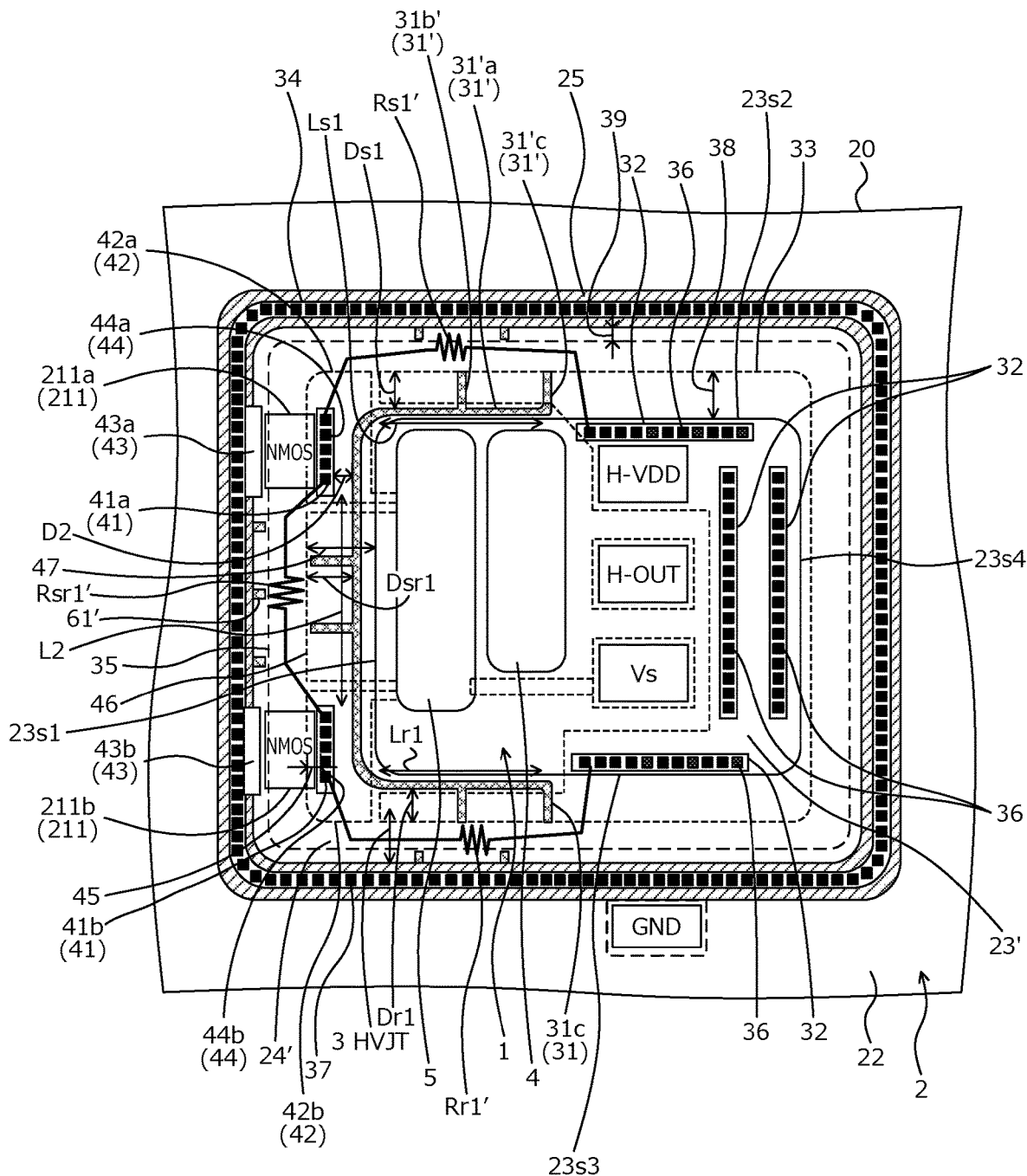
FIG. 11 is a plan view of another example of a layout of the high voltage integrated circuit device according to the fourth embodiment as viewed from the front surface side of the semiconductor substrate.

A structure of the semiconductor integrated circuit device (HVIC) according to a fourth embodiment will be described. FIG. 10 is a plan view of a layout of the high voltage integrated circuit device according to the fourth embodiment as viewed from the front surface side of the semiconductor substrate. FIG. 11 is a plan view of another example of a layout of the high voltage integrated circuit device according to the fourth embodiment as viewed from the front surface side of the semiconductor substrate. The HVIC according to the fourth embodiment is a HVIC in which the third embodiment is applied to the second embodiment.

In other words, in the fourth embodiment, similarly to the second embodiment, in the n⁻-type well region 24' that is the breakdown voltage region, p⁻-type isolation regions 53', 31' are disposed. Additionally, similarly to the third embodiment, the low-potential-side p⁻-type isolation regions 61, 61' are disposed so as to oppose the p⁻-type isolation regions 53', 31'. In this case, as depicted in FIG. 10, the p⁻-type isolation region 53' may be constituted by the U-shaped part 53a' alone. Further, as depicted in FIG. 11, the p⁻-type isolation region 31', similarly to the second embodiment, may be constituted by the U-shaped part 31a', the T-shaped part 31b' and the L-shaped part 31c'.

As described, according to the fourth embodiment, even when the third embodiment is applied to the second embodiments, effects similar to those of the first to third embodiments may be obtained.

Figure 12:
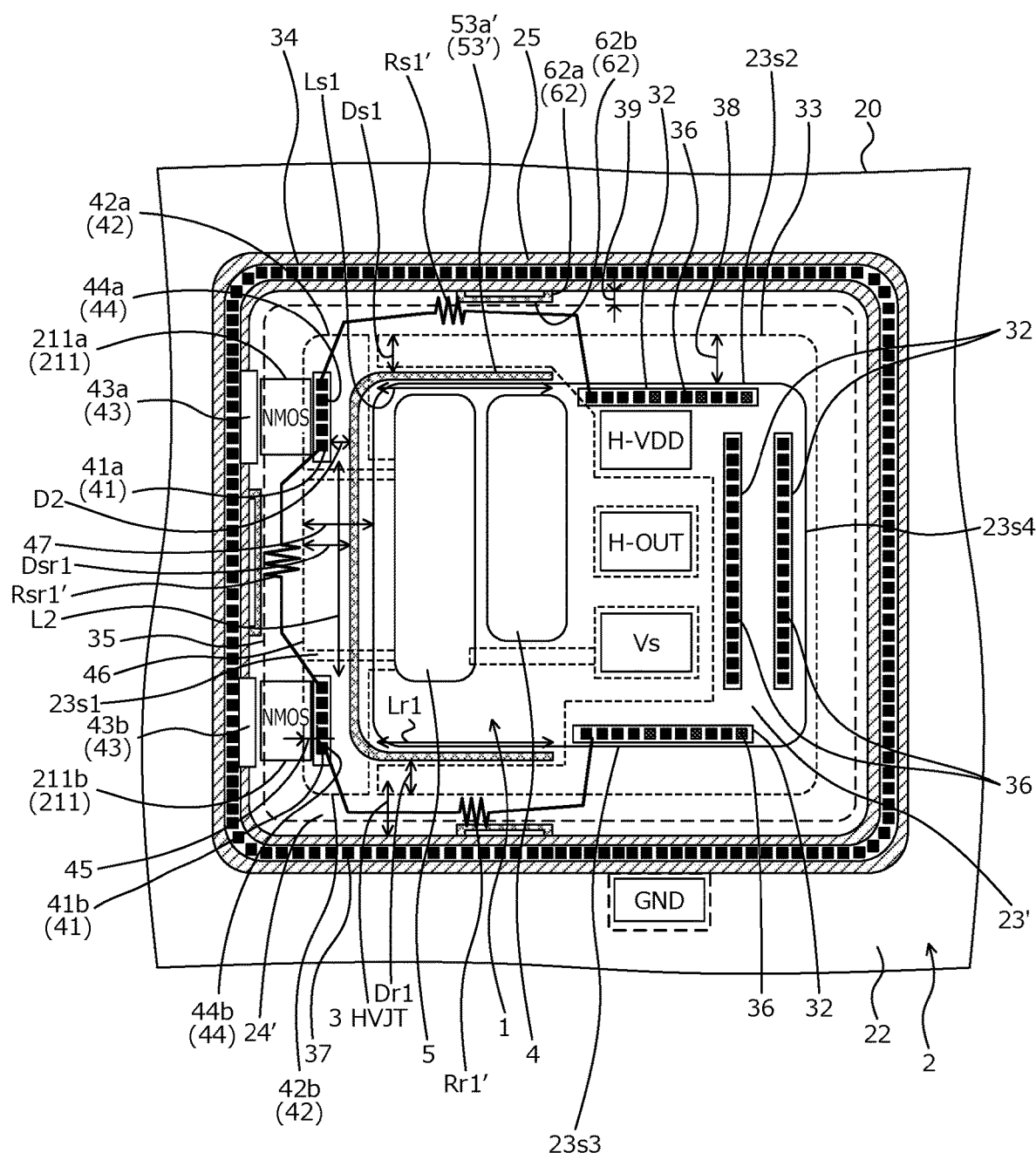
FIG. 12 is a plan view of a layout of the high voltage integrated circuit device according to a fifth embodiment as viewed from the front surface side of the semiconductor substrate.
Figure 13:
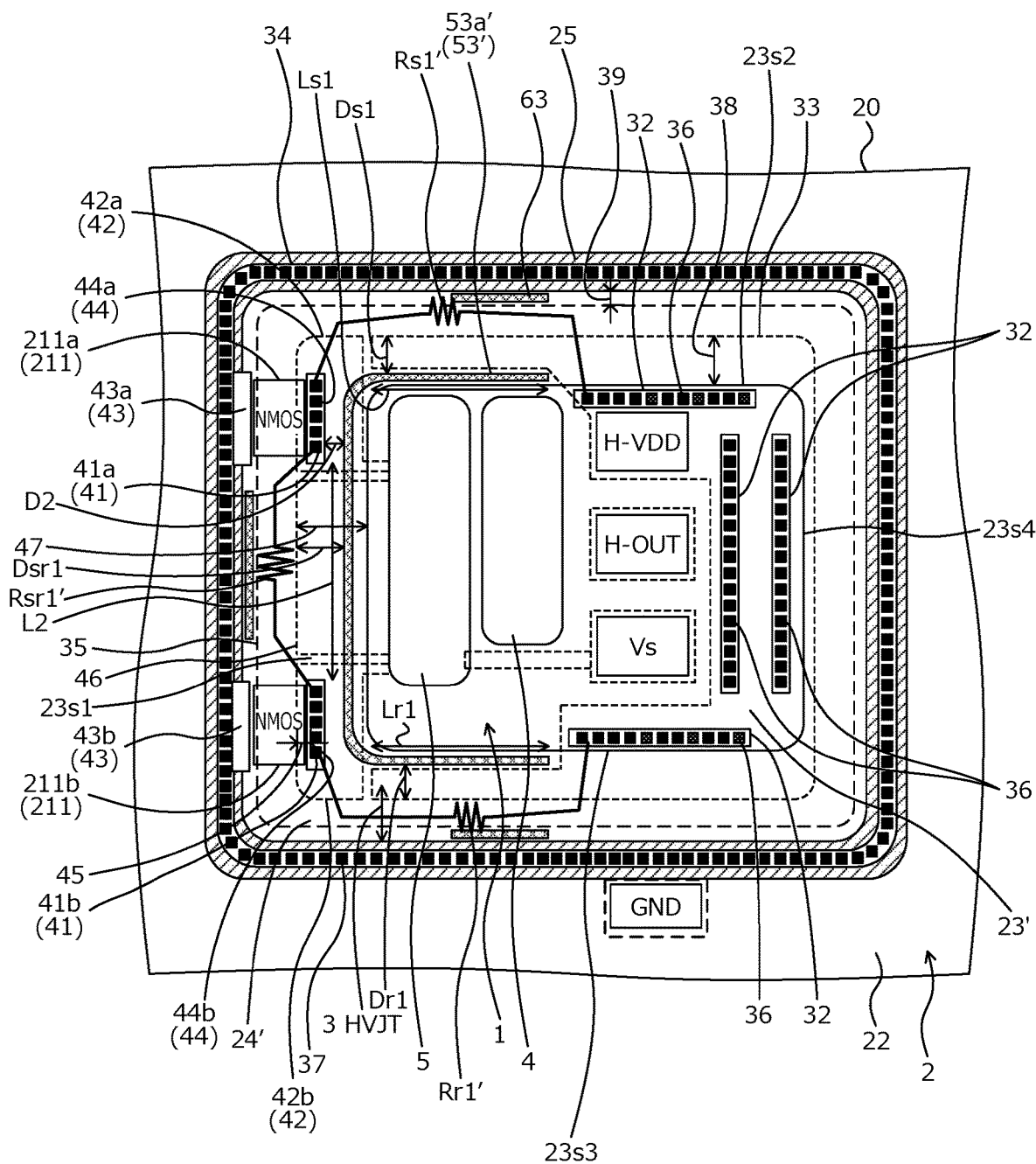
FIG. 13 is a plan view of another example of a layout of the high voltage integrated circuit device according to the fifth embodiment as viewed from the front surface side of the semiconductor substrate.

A structure of the semiconductor integrated circuit device (HVIC) according to a fifth embodiment will be described. FIG. 12 is a plan view of a layout of the high voltage integrated circuit device according to the fifth embodiment as viewed from the front surface side of the semiconductor substrate. FIG. 13 is a plan view of another example of a layout of the high voltage integrated circuit device according to the fifth embodiment as viewed from the front surface side of the semiconductor substrate. In the HVIC according to the fifth embodiment, a planar shape of low-potential-side p⁻-type isolation regions 62, 63 differs from that in the HVIC according to the fourth embodiment depicted in FIG. 10.

As depicted in FIG. 12, the low-potential-side p⁻-type isolation region 62, for example, is connected with the p-type ground region 25 so as to be substantially orthogonal to the p-type ground region 25 and thereby forming a T-shape and has a substantially U-shaped planar shape constituted by two adjacent linear parts 62a protruding toward the chip center (toward the p⁻-type isolation region 53') from a connection point with the p-type ground region 25 and a linear part 62b connected with the two linear parts 62a. The p⁻-type isolation region 62 needs not be in contact with the p-type ground region 25. Of course, the p⁻-type isolation region 62 needs not be orthogonal to the p-type ground region 25 and may form an obtuse angle with the p-type ground region 25.

Further, as depicted in FIG. 13, the low-potential-side p⁻-type isolation region 63, for example, may be constituted by a linear part that is parallel to the p-type ground region 25. The p⁻-type isolation regions 62, 63 extend from the p-type ground region 25 side toward the chip center and terminate at a position that is as close as possible to the inner periphery of the field plate 39 or are disposed at a position that is as close as possible to the inner periphery of the field plate 39; and this shape may be variously modified.

The fifth embodiment may be applied to the third embodiment. Further, the fifth embodiment may be applied to the HVIC according to the fourth embodiment depicted in FIG. 11.

As described, according to the fifth embodiment, even when the arrangement of low-potential-side p⁻-type isolation region is similar to that in the third and the fourth embodiments and the planar shape of the p⁻-type isolation regions differ, the effects similar to those of the first to the fourth embodiments may be obtained.

Figure 14:
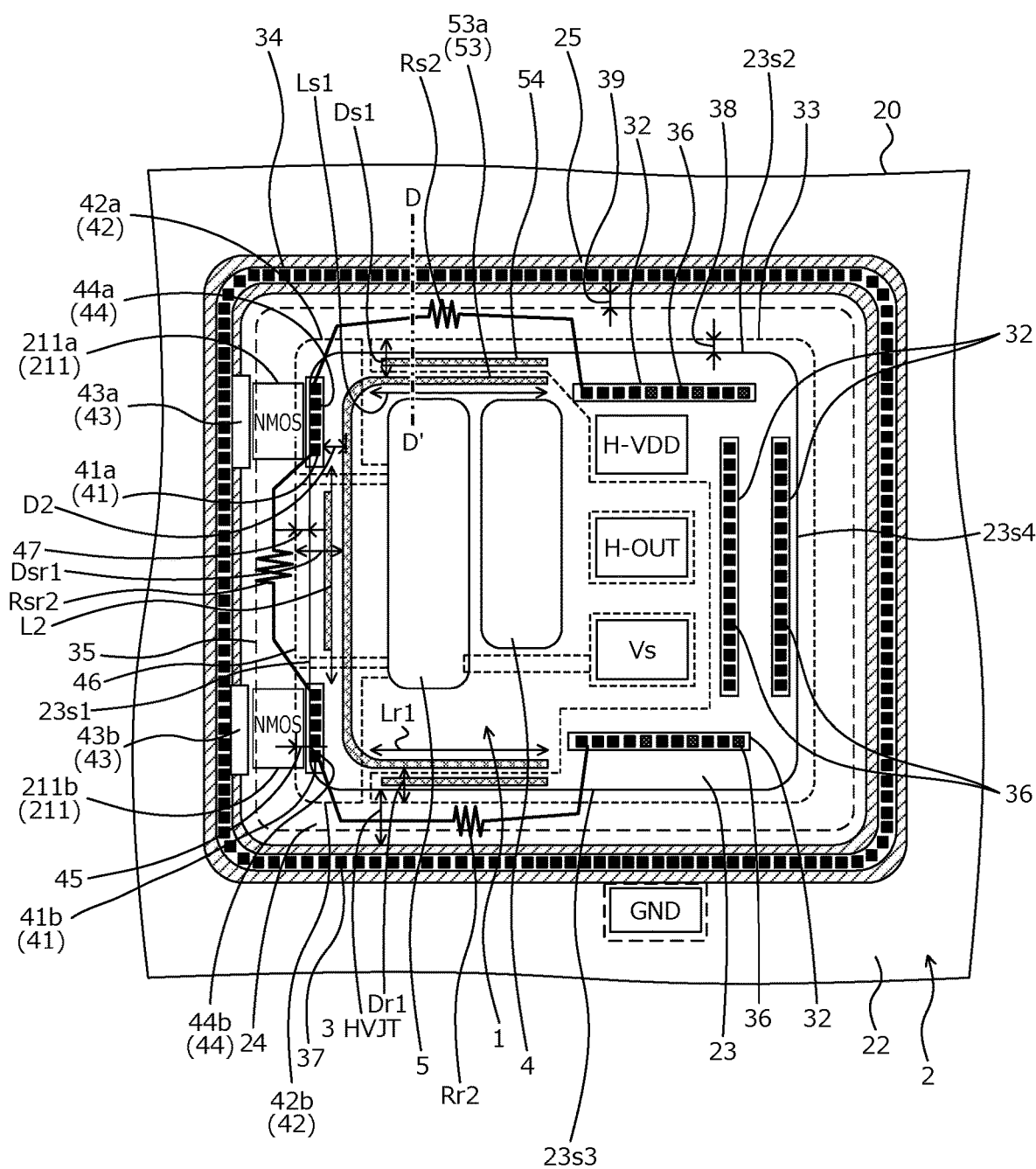
FIG. 14 is a plan view of a layout of the high voltage integrated circuit device according to a sixth embodiment as viewed from the front surface side of the semiconductor substrate.
Figure 15:
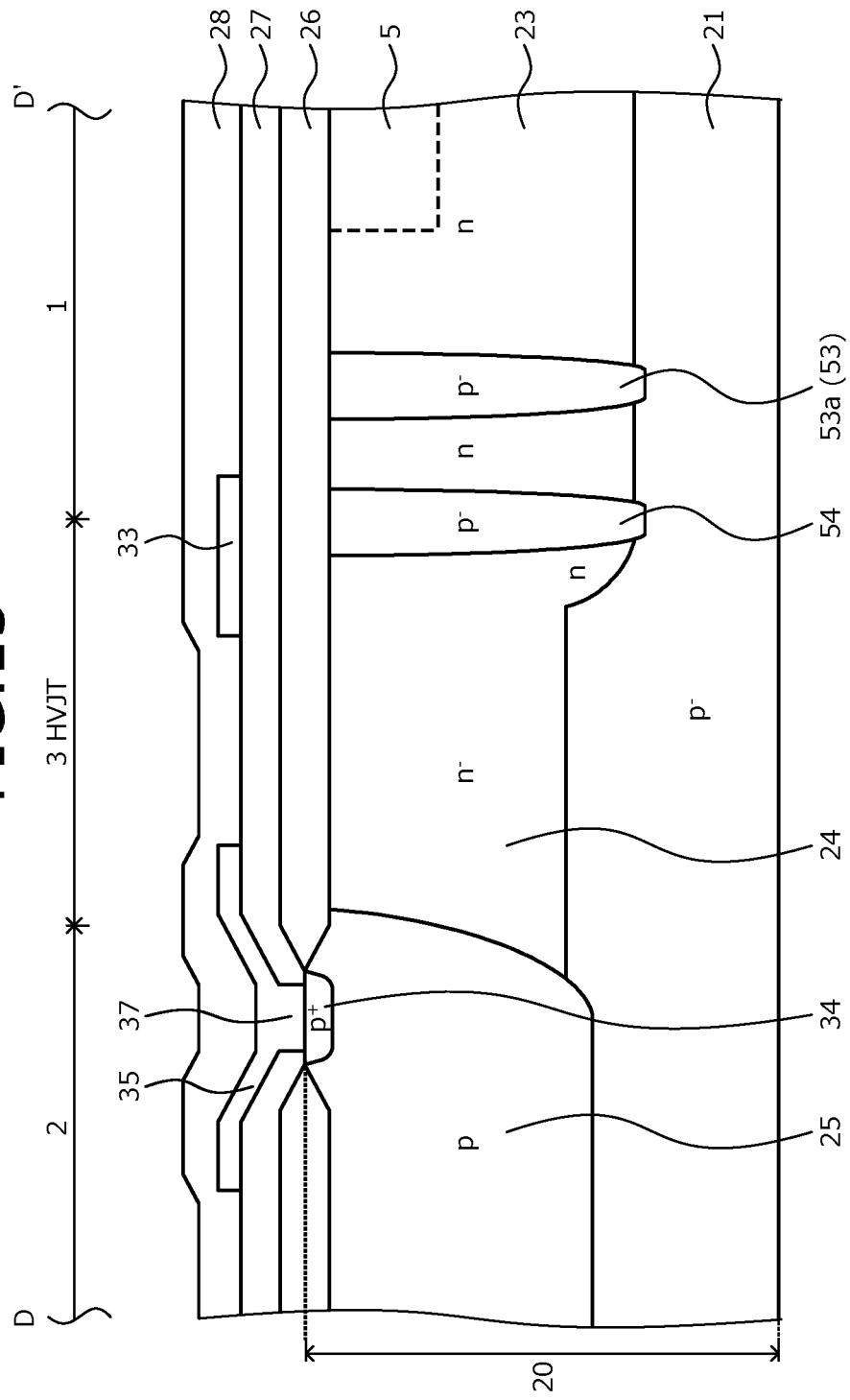
FIG. 15 is a cross-sectional view of a cross-sectional structure at cutting line D-D' in FIG. 14.

A structure of the semiconductor integrated circuit device (HVIC) according to a sixth embodiment will be described. FIG. 14 is a plan view of a layout of the high voltage integrated circuit device according to the sixth embodiment as viewed from the front surface side of the semiconductor substrate. FIG. 15 is a cross-sectional view of a cross-sectional structure at cutting line D-D' in FIG. 14. The HVIC according to the sixth embodiment differs from the HVIC according to the first embodiment depicted in FIG. 1, on the following two points.

A first difference is that a p⁻-type isolation region (hereinafter, first p⁻-type isolation region) 53 of the high potential side, similarly to the HVIC (the third embodiment) depicted in FIG. 8, is constituted by a U-shaped part 53a alone. In other words, the first p⁻-type isolation region 53 has no T-shaped part or L-shaped part.

A second difference is that in the n-type well region 23, a second p⁻-type isolation region 54 (additional part) is provided between the U-shaped part 53a of the first p⁻-type isolation region 53 and the three edges 23s1 to 23s3 of the outer periphery of the n-type well region 23, and is separated from the first p⁻-type isolation region 53.

The second p⁻-type isolation region 54 has a linear planar shape parallel to each of the edges 23s1 to 23s3 (i.e., the three edges constituting the U-shaped part 53a of the first p⁻-type isolation region 53) of the outer periphery of the n-type well region 23. While not depicted, a connection part connecting the first p⁻-type isolation region 53 and the second p⁻-type isolation region 54 may be provided. The connection part may be formed having a width that is equal to or less than widths of the first p⁻-type isolation region 53 and the second p⁻-type isolation region 54.

The second p⁻-type isolation region 54 is disposed between the n⁺-type pickup connect region 32 and the n⁺-type drain region 41 of the HVNMOS 211, and between the n⁺-type drain regions 41a, 41b of the HVNMOSs 211a, 211b. Further, the second p⁻-type isolation region 54, similarly to the first p⁻-type isolation region 53, penetrates the n-type well region 23 from the front surface of the semiconductor substrate 20, reaches the p⁻-type substrate rear-surface-side region 21, and is fixed at the electrical potential (the GND potential) of the p⁻-type substrate rear-surface-side region 21 (FIG. 15).

The second p⁻-type isolation region 54 has a function similar to that of the protruding part of the p⁻-type isolation region in the first embodiment. In other words, provision of the second p⁻-type isolation region 54 enables the resistance value of the parasitic resistances Rs2, Rr2 between the n⁺-type pickup connect region 32 and the n⁺-type drain region 41 of the HVNMOS 211 and the resistance value of the parasitic resistance Rsr2 between the n⁺-type drain regions 41a, 41b of the HVNMOSs 211a, 211b to be increased.

The sixth embodiment may be applied to the HVIC (the third embodiment) depicted in FIG. 8, the HVIC (the fourth embodiment) depicted in FIG. 10, and the HVIC (the fifth embodiment) depicted in FIGS. 12, 13.

As described, according to the sixth embodiment, even when the first p⁻-type isolation region is constituted by the U-shaped part alone, between the U-shaped part of the first p⁻-type isolation region and the edges of the outer periphery of the n-type well region 23, the second p⁻-type isolation region (additional part) is disposed parallel to the first p⁻-type isolation region, enabling effects similar to those of the first to the fifth embodiments to be obtained.

Figure 16:
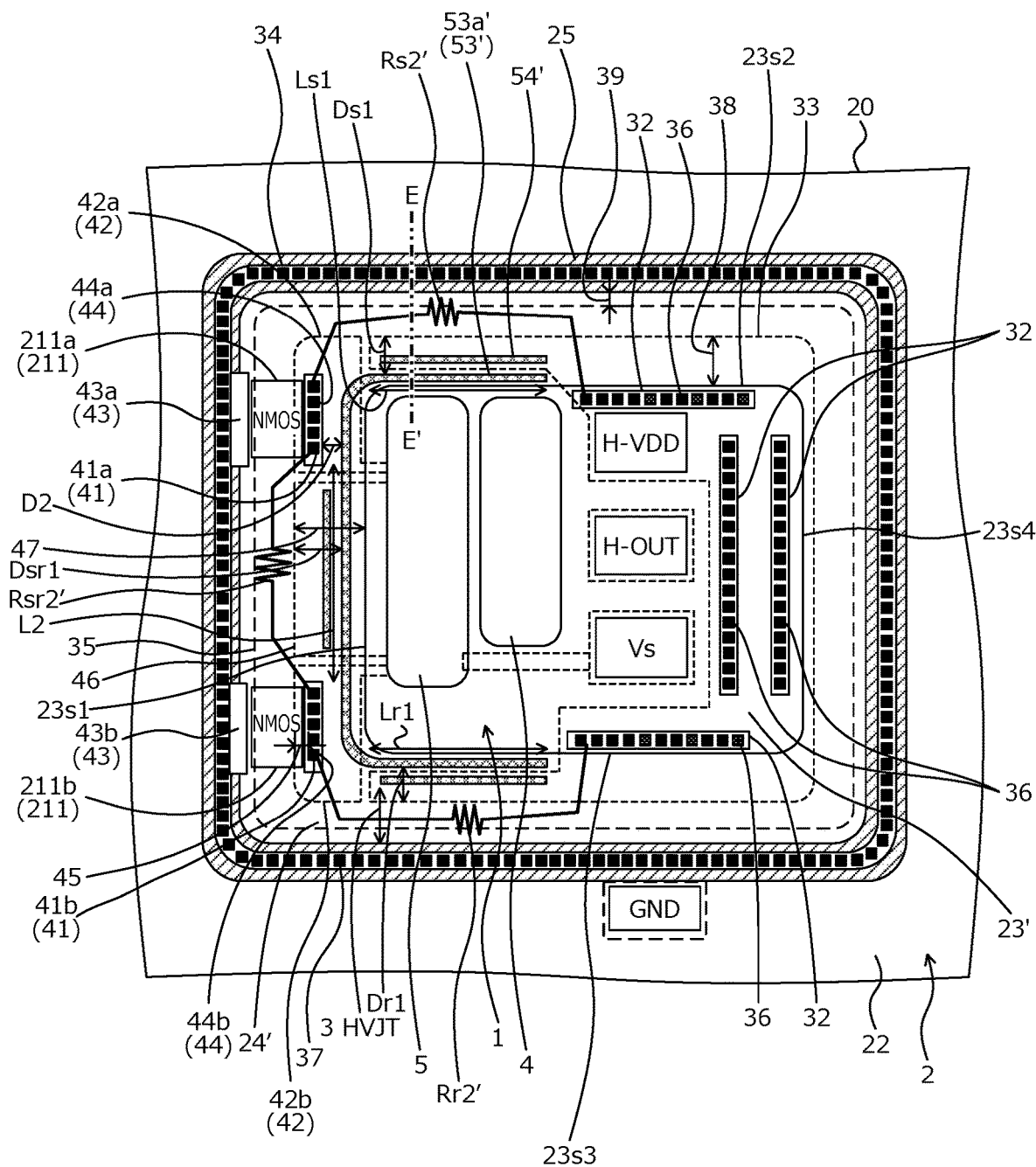
FIG. 16 is a plan view of a layout of the high voltage integrated circuit device according to a seventh embodiment, as viewed from the front surface side of the semiconductor substrate.
Figure 17:
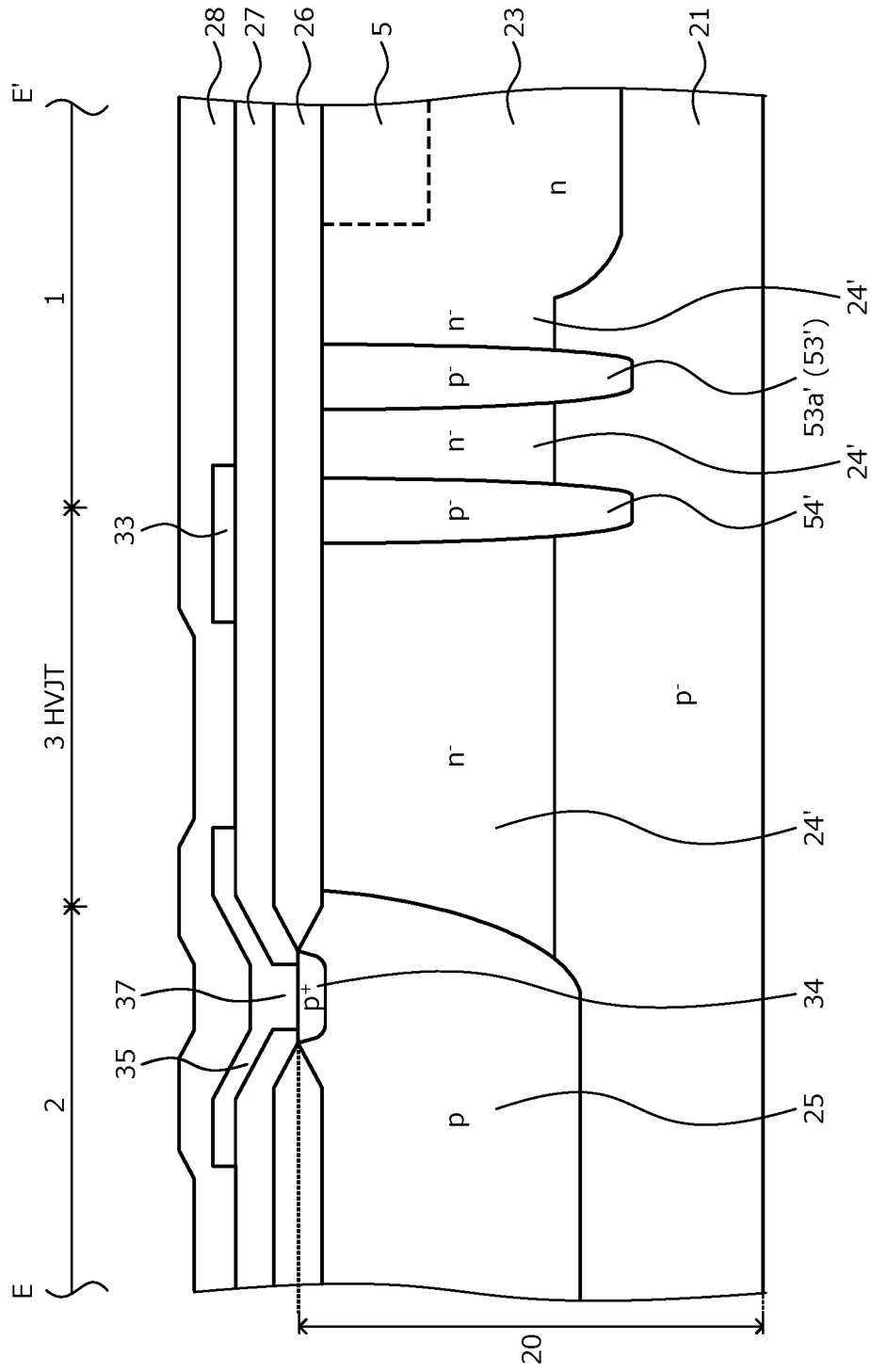
FIG. 17 is a cross-sectional-view of a cross-sectional structure at cutting line E-E' depicted in FIG. 16.

A structure of the semiconductor integrated circuit device according to a seventh embodiment (HVIC) will be described. FIG. 16 is a plan view of a layout of the high voltage integrated circuit device according to the seventh embodiment, as viewed from the front surface side of the semiconductor substrate. FIG. 17 is a cross-sectional-view of a cross-sectional structure at cutting line E-E' depicted in FIG. 16. The HVIC according to the seventh embodiment is the HVIC of the second embodiment to which the sixth embodiment is applied. In other words, the HVIC according to the seventh embodiment differs from the HVIC according to the second embodiment depicted in FIG. 1, on the following two points.

A first difference is that in the n⁻-type well region 24' that is the breakdown voltage region, the p⁻-type isolation region (first p⁻-type isolation region) 53' of the high potential side, similarly to the HVIC (the fourth embodiment) depicted in FIG. 10, is constituted by the U-shaped part 53a' alone. In other words, the first p⁻-type isolation region 53' does not have the protruding part.

A second difference is that in the n⁻-type well region 24', the second p⁻-type isolation region 54' (additional part) is provided between the U-shaped part 53a' of the first p⁻-type isolation region 53' and the outer peripheries of the field plates 38, 47 of the high potential side, and is separated from the first p⁻-type isolation region 53'. Each second p⁻-type isolation region 54' has a linear planar shape parallel to each outer periphery (i.e., the three edges constituting the U-shaped part 53a' of the first p⁻-type isolation region 53) of the field plates 38, 47 of the high potential side. Further, the second p⁻-type isolation region 54' is disposed beneath the field plates 38, 47 of the high potential side. The planar shape of the second p⁻-type isolation region 54' needs not be parallel to the outer peripheries of the field plates 38, 47.

The second p⁻-type isolation region 54', similarly to the sixth embodiment, is disposed between the n⁺-type pickup connect region 32 and the n⁺-type drain region 41 of the HVNMOS 211, and between the n⁺-type drain regions 41a, 41b of the HVNMOS 211a,211b. Further, the second p⁻-type isolation region 54', similarly to the first p⁻-type isolation region 53', penetrates the n⁻-type well region 24' from the front surface of the semiconductor substrate 20, reaches the p⁻-type substrate rear-surface-side region 21, and is fixed to the electric potential (the GND potential) of the p⁻-type substrate rear-surface-side region 21 (FIG. 17).

In this manner, even when the first and the second p⁻-type isolation regions 53', 54' are disposed in the breakdown voltage region (the n⁻-type well region 24), similarly to the sixth embodiment, resistance values of the parasitic resistances Rs2', Rr2' between the n⁺-type pickup connect region 32 and the n⁺-type drain region 41 of the HVNMOS 211, and the resistance value of the parasitic resistance Rsr2' between the n⁺-type drain regions 41a, 41b of the HVNMOSs 211a, 211b may be increased.

As described, according to the seventh embodiment, even when the second p⁻-type isolation region is disposed in the breakdown voltage region (the n⁻-type well region), effects similar to those of the first to the sixth embodiments are obtained.

Figure 18:
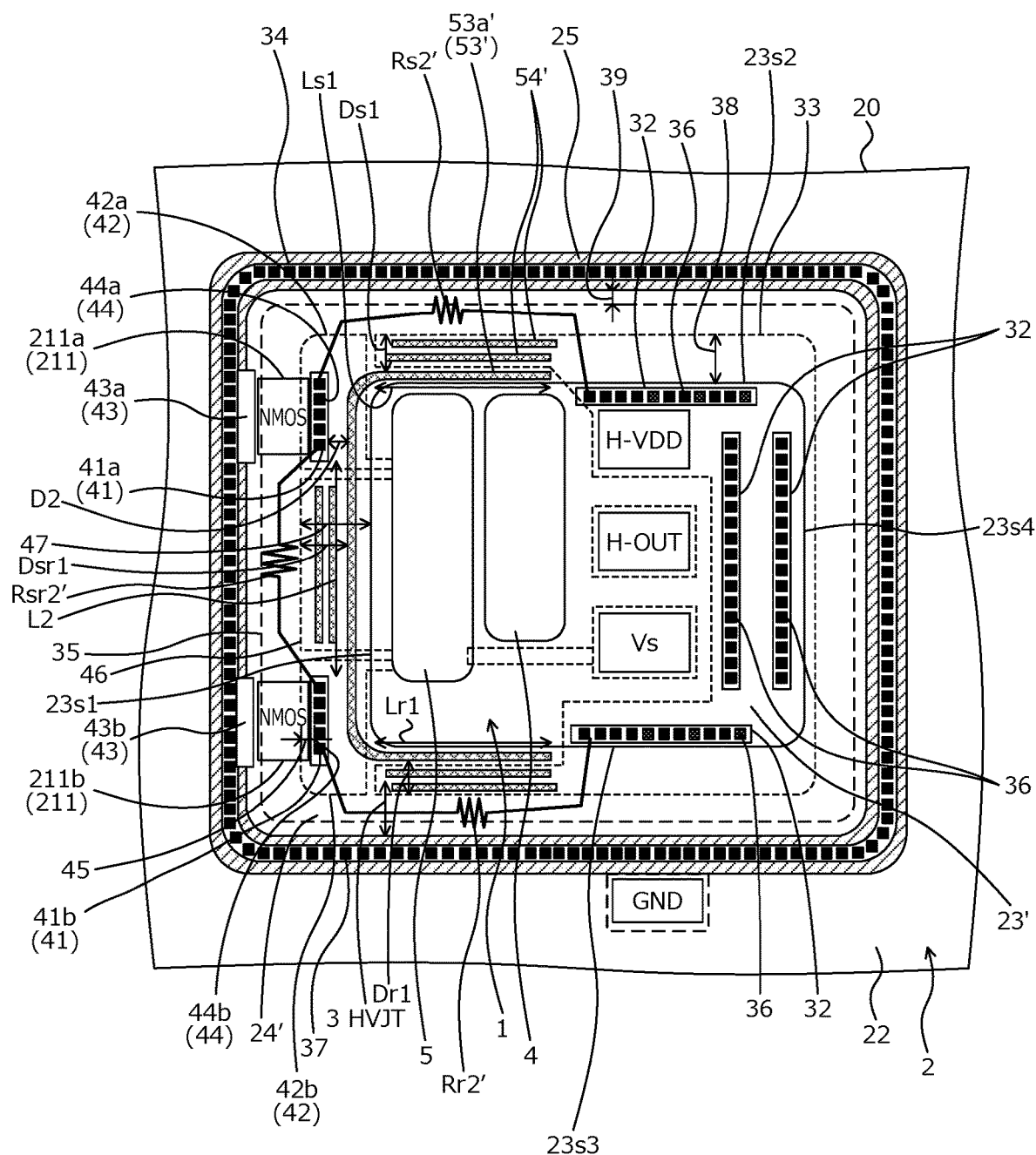
FIG. 18 is a plan view of a layout of the high voltage integrated circuit device according to an eighth embodiment as viewed from the front surface side of the semiconductor substrate.

A structure of the semiconductor integrated circuit device (HVIC) according to an eighth embodiment will be described. FIG. 18 is a plan view of a layout of the high voltage integrated circuit device according to the eighth embodiment as viewed from the front surface side of the semiconductor substrate. The HVIC according to the eighth embodiment differs from the HVIC according to the seventh embodiment in that two or more of the second p⁻-type isolation regions 54' (additional parts) are disposed having a striped layout as viewed from the front surface side of the semiconductor substrate. All of the second p⁻-type isolation regions 54' are disposed in the n⁻-type well region 24 and are disposed beneath the field plates 38, 47 of the high potential side.

The eighth embodiment may be applied to the sixth embodiment.

As described, according to the eighth embodiment, even when two or more of the second p⁻-type isolation regions are disposed having a striped layout as viewed from the front surface side of the semiconductor substrate, effects similar to those of the first to the seventh embodiments may be obtained.

The present invention is not limited to the described embodiments and in the embodiments of the present invention, various modification within a range not departing from the spirit of the invention are possible. For example, application is possible to various integrated circuits in which a parasitic pn junction region (parasitic pn diode) is formed between high-side circuit part and a HVJT. Further, in place of a self-isolation type using a self-shielding scheme, an epitaxial substrate may be used in which on a p⁻-type semiconductor substrate constituting the p⁻-type substrate rear-surface-side region, an n-type or a p-type epitaxial layer is formed by epitaxial growth.

When an epitaxial substrate in which on a p⁻-type semiconductor substrate, p-type epitaxial layer constituting a p-type well region (p-type ground region) is formed by epitaxial growth, an n-type embedded layer may be provided between the p⁻-type semiconductor substrate and a part of the p-type epitaxial layer constituting a p-type ground region. Further, a part of the p⁻-type semiconductor substrate may be left as is so as to reach the front surface of the p⁻-type semiconductor substrate from the p⁻-type substrate rear-surface-side region, to thereby constitute the p⁻-type isolation region. Further, the embodiments are similarly implemented when the conductivity type (n-type, p-type) of the semiconductor layers or semiconductor regions are reversed.

According to the embodiments of the present invention, the resistance value of the parasitic resistance between second-conductivity-type high concentration regions (pickup contact region of the second electric potential (HVDD pad)) and second-conductivity-type region (drain region) of the level shifter (insulated gate semiconductor element) may be increased as compared to a case in which the protruding part of the first isolating region is not provided. Therefore, the parasitic resistance may be used as the level shift resistor. Further, when the parasitic resistance is used as the level shift resistor, the distance that is from the second-conductivity-type region of the insulated gate semiconductor element to the second-conductivity-type high concentration region and that is for obtaining a predetermined resistance value of the parasitic resistance may be shortened as compared to a case in which the protruding part of the first isolating region is not provided.

According to the semiconductor integrated circuit device of the embodiments of the present invention, the high voltage integrated circuit device of the self-shielding scheme and having the level shifter (the n-channel MOSFET of the level shift circuit) and the high-voltage junction termination region (HVJT) integrated therein achieves effects in that breakdown voltage and long-term reliability may be maintained while reductions in semiconductor chip size may be achieved without layout design constraints.

As described, the semiconductor integrated circuit device according to the embodiments of the present invention, for example, are useful for high voltage integrated circuit devices used when an ON/OFF driving signal is propagated to a gate of a power device in a PWM inverter, switching power supply, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device comprising:
   a first second-conductivity-type well region of a second conductivity type provided in a surface layer of a first-conductivity-type semiconductor layer of a first conductivity type;
   a circuit region formed in the first second-conductivity-type well region;
   a second second-conductivity-type well region of the second conductivity type provided in the surface layer of the first-conductivity-type semiconductor layer and in contact with the first second-conductivity-type well region, the second second-conductivity-type well region surrounding a periphery of the first second-conductivity-type well region and having an impurity concentration that is lower than that of the first second-conductivity-type well region;
   a first-conductivity-type well region of the first conductivity type provided in the surface layer of the first-conductivity-type semiconductor layer and in contact with the second second-conductivity-type well region, the first-conductivity-type well region surrounding a periphery of the second second-conductivity-type well region;
   a first isolating region of the first conductivity type provided separated from and at a distance farther inward than is the first-conductivity-type well region, the first isolating region having a part that in an opened layout, is interposed between the circuit region and the first-conductivity-type well region and that is provided at a depth reaching the first-conductivity-type semiconductor layer from a surface of the first second-conductivity-type well region or the second second-conductivity-type well region;
   a second-conductivity-type high concentration region of the second conductivity type provided in the first second-conductivity-type well region and having an impurity concentration that is higher than that of the first second-conductivity-type well region;

a first electrode in contact with the second-conductivity-type high concentration region;

a first field plate that is a part of the first electrode extended farther outward than is an outer periphery of the first second-conductivity-type well region; and an insulated gate semiconductor element having, as a drain region, a second-conductivity-type region of the second conductivity type of the first second-conductivity-type well region or the second second-conductivity-type well region, the second-conductivity-type region being provided at a distance farther inward than is the first isolating region; the insulated gate semiconductor element having, as a drift region, the first second-conductivity-type well region or the second second-conductivity-type well region, or first second-conductivity-type well region and the second second-conductivity-type well region, and the insulated gate semiconductor element having, as a base region, the first-conductivity-type well region, wherein the first isolating region includes any one of:
a protruding part at a location other than inside the drain region and protruding farther outward than is the outer periphery of the first second-conductivity-type well region, and an additional part provided separated from and farther outward than is the first isolating region, the protruding part sandwiches the interlayer insulating film with the first field plate and is covered by the first field plate, the protruding part being positioned farther inward than is the outer periphery of the first field plate and the protruding part being near the outer periphery of the first field plate, and the additional part sandwiches the interlayer insulating film with the first field plate and is covered by the first field plate, the additional part being positioned farther inward than is the outer periphery of the first field plate and the additional part being near the outer periphery of the first field plate.

2. The semiconductor integrated circuit device according to claim 1, wherein
the protruding part is provided between the second-conductivity-type region and the second-conductivity-type high concentration region, and
the additional part is provided between the second-conductivity-type region and the second-conductivity-type high concentration region.

3. The semiconductor integrated circuit device according to claim 1, wherein
two of the insulated gate semiconductor elements are provided separated from each other,
the protruding part is provided between the second-conductivity-type regions of the two insulated gate semiconductor elements, and
the additional part is provided between the second-conductivity-type regions of the two insulated gate semiconductor elements.

4. The semiconductor integrated circuit device according to claim 1 and further comprising:
a second isolation region provided in the second second-conductivity-type well region and opposing the first isolating region on an inner side;
a first-conductivity-type high concentration region of the first conductivity type provided in the first-conductivity-type well region, the first-conductivity-type high concentration region having an impurity concentration higher than that of the first-conductivity-type well region;
a second electrode in contact with the first-conductivity-type high concentration region; and
a second field plate that is a part of the second electrode extending farther inward than is an inner periphery of the first-conductivity-type well region, wherein
the second isolation region, at a location other than an outer side of the drain region, sandwiches the interlayer insulating film with the second field plate and is covered by the second field plate, the second isolation region being positioned farther inward than is an inner periphery of the second field plate and the second isolation region being positioned near the inner periphery of the second field plate.

5. The semiconductor integrated circuit device according to claim 1, wherein
the protruding part includes any one of:
a T-shaped part connected with the first isolating region so as to be orthogonal to the first isolating region and form a T-shape, and T-shaped part protruding farther outward than is the outer periphery of the first second-conductivity-type well region, from a connection point with the first isolating region,
an L-shaped part curving a part of the first isolating region so as to be orthogonal to a remaining part of the first isolating region and form an L-shape, the L-shaped part protruding farther outward from the curved part than is the outer periphery of the first second-conductivity-type well region, and
both the T-shaped part and the L-shaped part.

6. The semiconductor integrated circuit device according to claim 1, wherein
the additional part has a linear shape extending parallel to the first isolating region.

7. The semiconductor integrated circuit device according to claim 1 and further comprising
a connection part connecting the additional part and the first isolating region.

8. The semiconductor integrated circuit device according to claim 4, wherein
the second isolation region is provided between the second-conductivity-type region and the second-conductivity-type high concentration region.

9. The semiconductor integrated circuit device according claim 4, wherein
two of the insulated gate semiconductor elements are provided separated from each other, and
the second isolation region is provided between the second-conductivity-type regions of the two insulated gate semiconductor elements.

10. The semiconductor integrated circuit device according to claim 4, and further comprising:
a third second-conductivity-type well region of the second conductivity type provided in the surface layer of the first-conductivity-type semiconductor layer, the third second-conductivity-type well region opposing the first second-conductivity-type well region across the first-conductivity-type well region;
a first sub-circuit provided in the third second-conductivity-type well region;
a second sub-circuit provided in the first second-conductivity-type well region; and
a third sub-circuit provided in the second second-conductivity-type well region and the first-conductivity-type well region, the third sub-circuit being connected between the first sub-circuit and the second sub-circuit, and configured to convert a voltage level of a signal input from the first sub-circuit and to output the signal to the second sub-circuit, wherein the third sub-circuit includes:
an insulated gate semiconductor element; and
a resistor constituted by parasitic resistance from the second-conductivity-type region to the second-conductivity-type high concentration region, and the second sub-circuit outputs based on a signal output from a connection point of the second-conductivity-type region and the resistor, a gate signal of a transistor of a high potential side among two transistors connected serially.

11. A semiconductor integrated circuit device comprising:
a first second-conductivity-type well region of a second conductivity type provided in a surface layer of a first-conductivity-type semiconductor layer of a first conductivity type;
a circuit region formed in the first second-conductivity-type well region;
a second second-conductivity-type well region of the second conductivity type provided in the surface layer of the first-conductivity-type semiconductor layer and in contact with the first second-conductivity-type well region, the second second-conductivity-type well region surrounding a periphery of the first second-conductivity-type well region and having an impurity concentration that is lower than that of the first second-conductivity-type well region;
a first-conductivity-type well region of the first conductivity type provided in the surface layer of the first-conductivity-type semiconductor layer and in contact with the second second-conductivity-type well region, the first-conductivity-type well region surrounding a periphery of the second second-conductivity-type well region;
a first isolating region of the first conductivity type provided separated from and at a distance farther inward than is the first-conductivity-type well region, the first isolating region having a part that in an opened layout, is interposed between the circuit region and the first-conductivity-type well region and that is provided at a depth reaching the first-conductivity-type semiconductor layer from a surface of the first second-conductivity-type well region or the second second-conductivity-type well region;
a second-conductivity-type high concentration region of the second conductivity type provided in the first second-conductivity-type well region and having an impurity concentration that is higher than that of the first second-conductivity-type well region;
a first electrode in contact with the second-conductivity-type high concentration region;
a second isolation region provided in the second second-conductivity-type well region and opposing the first isolating region on an inner side;
a first-conductivity-type high concentration region of the first conductivity type provided in the first-conductivity-type well region, the first-conductivity-type high concentration region having an impurity concentration higher than that of the first-conductivity-type well region;
a second electrode in contact with the first-conductivity-type high concentration region;

a first field plate that is a part of the first electrode extending farther outward than is an outer periphery of the first second-conductivity-type well region;
a second field plate that is part of the second electrode extending farther inward than is an inner periphery of the first-conductivity-type well region; and
an insulated gate semiconductor element having, as a drain region, a second-conductivity-type region of the second conductivity type of the first second-conductivity-type well region or the second second-conductivity-type well region, the second-conductivity-type region being provided at a distance farther inward than is the first isolating region; the insulated gate semiconductor element having, as a drift region, the first second-conductivity-type well region or the second second-conductivity-type well region, or first second-conductivity-type well region and the second second-conductivity-type well region; and the insulated gate semiconductor element having, as a base region, the first-conductivity-type well region, wherein
the second isolation region, at a location other than an outer side of the drain region, sandwiches the interlayer insulating film with the second field plate and is covered by the second field plate, the second isolation region being positioned farther inward than is an inner periphery of the second field plate and the second isolation region being positioned near the inner periphery of the second field plate.

12. The semiconductor integrated circuit device according to claim 11, wherein
the second isolation region is provided between the second-conductivity-type region and the second-conductivity-type high concentration region.

13. The semiconductor integrated circuit device according to claim 11, wherein
two of the insulated gate semiconductor elements are provided separated from each other, and
the second isolation region is provided between the second-conductivity-type regions of the two insulated gate semiconductor elements.

14. The semiconductor integrated circuit device according to claim 11, and further comprising:
a third second-conductivity-type well region of the second conductivity type provided in the surface layer of the first-conductivity-type semiconductor layer, the third second-conductivity-type well region opposing the first second-conductivity-type well region across the first-conductivity-type well region;
a first sub-circuit provided in the third second-conductivity-type well region;
a second sub-circuit provided in the first second-conductivity-type well region; and
a third sub-circuit provided in the second second-conductivity-type well region and the first-conductivity-type well region, the third sub-circuit being connected between the first sub-circuit and the second sub-circuit, and configured to convert a voltage level of a signal input from the first sub-circuit and to output the signal to the second sub-circuit, wherein
the third sub-circuit includes:
an insulated gate semiconductor element; and
a resistor constituted by parasitic resistance from the second-conductivity-type region to the second-conductivity-type high concentration region, and
the second sub-circuit outputs based on a signal output from a connection point of the second-conductivitytype region and the resistor, a gate signal of a transistor of a high potential side among two transistors connected serially.

* * * * *

UNITED STATES PATENT AND TRADEMARK OFFICE
CERTIFICATE OF CORRECTION

PATENT NO.       : 10,658,504 B2  
APPLICATION NO.  : 16/138214  
DATED            : May 19, 2020  
INVENTOR(S)      : Masaharu Yamaji Page 1 of 1

It is certified that error appears in the above-identified patent and that said Letters Patent is hereby corrected as shown below:

In the Claims

Column 36, Line 46 In Claim 9, after "according" insert -- to --.

Signed and Sealed this  
Twenty-eighth Day of July, 2020

Andrei Iancu  
*Director of the United States Patent and Trademark Office*